US012124940B2

(12) United States Patent
Liu et al.

(10) Patent No.: US 12,124,940 B2
(45) Date of Patent: *Oct. 22, 2024

(54) PROCESSING METHOD AND DEVICE, OPERATION METHOD AND DEVICE

(71) Applicant: Shanghai Cambricon Information Technology Co., Ltd, Pudong New Area (CN)

(72) Inventors: Shaoli Liu, Pudong New Area (CN); Xuda Zhou, Pudong New Area (CN); Zidong Du, Pudong New Area (CN); Daofu Liu, Pudong New Area (CN)

(73) Assignee: SHANGHAI CAMBRICON INFORMATION TECHNOLOGY CO., LTD., Pudong New Area (CN)

( * ) Notice: Subject to any disclaimer, the term of this patent is extended or adjusted under 35 U.S.C. 154(b) by 333 days.

This patent is subject to a terminal disclaimer.

(21) Appl. No.: 16/831,273

(22) Filed: Mar. 26, 2020

(65) Prior Publication Data
US 2020/0265300 A1 Aug. 20, 2020

Related U.S. Application Data

(63) Continuation of application No. 16/528,624, filed on Aug. 1, 2019, now Pat. No. 10,657,439, and a
(Continued)

(30) Foreign Application Priority Data

Oct. 24, 2017 (CN) .......................... 201711061069.5

(51) Int. Cl.
*G06N 3/063* (2023.01)
*G06F 9/30* (2018.01)
(Continued)

(52) U.S. Cl.
CPC .......... *G06N 3/063* (2013.01); *G06F 9/3001* (2013.01); *G06F 9/30029* (2013.01); (Continued)

(58) Field of Classification Search
None
See application file for complete search history.

(56) References Cited

U.S. PATENT DOCUMENTS 5,768,179 A 6/1998 Hart
10,140,574 B2 * 11/2018 Henry ...................... G06N 3/04
(Continued)

FOREIGN PATENT DOCUMENTS

CN 101866213 A 10/2010
CN 105512723 A 4/2016
(Continued)

OTHER PUBLICATIONS

Graves, Alex, "Generating Sequences With Recurrent Neural Networks," Univ. Toronto, 2014, 43pg. (Year: 2014).*
(Continued)

*Primary Examiner* — Ryan D. Coyer
(74) *Attorney, Agent, or Firm* — Getech Law LLC; Jun Ye

(57) ABSTRACT

The application provides an operation method and device. Quantized data is looked up to realize an operation, which simplifies the structure and reduces the computation energy consumption of the data, meanwhile, a plurality of operations are realized.

16 Claims, 3 Drawing Sheets

Related U.S. Application Data continuation of application No. 16/482,710, filed as application No. PCT/CN2018/095548 on Jul. 13, 2018.

(51) Int. Cl.
  *G06N 3/06* (2006.01)
  *H03M 7/42* (2006.01)
(52) U.S. Cl.
  CPC ........ *G06F 9/3005* (2013.01); *G06F 9/30145* (2013.01); *G06N 3/06* (2013.01); *H03M 7/425* (2013.01)

(56) References Cited

U.S. PATENT DOCUMENTS

| | | | |
|---|---|---|---|
| 10,949,766 B2* | 3/2021 | Akerib | G06N 3/08 |
| 11,074,072 B2* | 7/2021 | Nealis | G06F 7/5443 |
| 2010/0296746 A1* | 11/2010 | Strom | G06T 9/00 382/233 |
| 2011/0066580 A1* | 3/2011 | Tsai | G06N 3/08 706/25 |
| 2014/0198950 A1 | 7/2014 | Tanaka et al. | |
| 2015/0170021 A1 | 6/2015 | Lupon et al. | |
| 2015/0180482 A1 | 6/2015 | Bourstein et al. | |
| 2017/0031430 A1 | 2/2017 | Ansorregui et al. | |
| 2017/0147053 A1 | 5/2017 | Chang | |
| 2019/0200904 A1* | 7/2019 | Gupta | A61B 5/1455 |
| 2020/0285892 A1* | 9/2020 | Baum | G06F 18/285 |

FOREIGN PATENT DOCUMENTS

| | | |
|---|---|---|
| CN | 106296692 A | 1/2017 |
| CN | 106485316 A | 3/2017 |
| CN | 107229598 A | 10/2017 |
| CN | 107257958 A | 10/2017 |
| CN | 106529609 B | 11/2019 |
| CN | 106598731 B | 11/2019 |
| DE | 102105007943 A1 | 1/2016 |
| EP | 0528511 A2 | 2/1993 |
| EP | 3153999 A2 | 4/2017 |
| EP | 3153999 A3 | 7/2017 |
| JP | H07244494 A | 9/1995 |
| JP | 2004220437 A | 8/2004 |
| KR | 100243353 B1 | 2/2000 |
| WO | 2017123334 A1 | 7/2017 |

OTHER PUBLICATIONS

Razlighi et al., "LookNN: Neural Network with No Multiplication," IEEE, 2017, 6pg. (Year: 2017).*
Zhang et al., "Cambricon-X: An Accelerator for Sparse Neural Networks," IEEE, 2016, 12pg. (Year: 2016).*
Sampson et al., Approximate Storage in Solid-State Memories, MICRO'46, Dec. 2013, Davis, CA, USA; ACM 978-1-4503-2638; 3 pages.
CN201110989575.4, Official Action issued Jan. 3, 2020, 11 pages. (No English translation).
XDUP269400, vol. 1, "Digital System Design Basics"; 8.2 Volatile Memory; May 2010, 9 pages.
Zhang Shijin et al; "Cambricon-X: An accelerator for sparse neural networks", 2016 49th Annual IEEE/ACM International Symposium on Microarchitecture (MICRO), IEEE, Oct. 15, 2016, 12 pages.
Li Da et al; "Evaluating the Energy Efficiency of Deep Convolutional Neural Networks on CPUs and GPUs", 2016 IEEE International Conferences on Big Data and Cloud Computing (BDCLOUD), IEEE, Oct. 8, 2016, 8 pages.
Kang Sanghoon et al; "A 0.53mW ultra-low-power 3D face frontalization processor for face recognition with human-level accuracy in wearable devices", 2017 IEEE International Symposium on Circuits and Systems (ISCAS), IEEE, May 28, 2020; 4 pages.
Razlighi Mohammad Samragh et al; "LookNN: Neural network with no multiplication", Design, Automation & Test in Europe Conference & Exhibition 2017, EDAA, Mar. 27, 2020; 6 pages.
EP19215829; European Search Report mailed Apr. 20, 2020; 9 pages.
EP19215858; European Search Report mailed May 15, 2020; 13 pages.
EP 18 868 807.1—Communication pursuant to Article 94(3) EPC, mailed Apr. 9, 2021, 7 pages.
EP 19 215 859.0—Communication pursuant to Article 94(3) EPC, mailed Oct. 29, 2021, 7 pages.
EP 19 215 860.8—Communication pursuant to Article 94(3) EPC, mailed Oct. 22, 2021, 12 pages.
CN 201711061069.5—First Office Action, mailed Jun. 3, 2020, 14 pages. (no English translation).
CN 201711004974.7—First Office Action, mailed Jul. 28, 2020, 15 pages. (no English translation).
Razlighi, et al., "LookNN: Neural Network with No Multiplication", IEEE, 2017, 7 pages.
Han, et al., "A Deep Neural Network Compression Pipeline: Pruning, Quantization, Huffman Encoding", arXiv, Oct. 1, 2015, 11 pages.
CN 201710989575.4—Second Office Action, mailed Jul. 1, 2020, 3 pages. (no English translation).
PCT/CN2018/095548—International Search Report, mailed Sep. 29, 2018, 9 pages. (no English translation).
EP 18868807.1—Extended European Search Report, mailed Jul. 8, 2020, 9 pages.
EP 18868807.1—Response to the Invitation to File Search Results Pursuant to Rule 70b(1) EPC dated Apr. 2, 2021, filed Feb. 18, 2021, 14 pages.
EP 18868807.1—Invitation to File Search Results Pursuant to Rule 70b(1) EPC, mailed Apr. 2, 2021, 2 pages.
EP 19215859.0—Extended European Search Report, mailed Apr. 29, 2020, 9 pages.
EP 19215860.8—Extended European Search Report, mailed Apr. 14, 2020, 16 pages.
Oh, et al., "A 320 mW 342 GOPS Real-Time Dynamic Object Recognition Processor for HD 720p Video Streams", IEEE Journal of Solid-State Circuits, vol. 48, No. 1, Jan. 2013, 13 pages.
Illig, et al, "Two-Dimensional Convolution on the SCC", Many-Core Architecture Research Community Symposium, Oct. 18, 2013, 7 pages.
Mei, et al., "Energy Efficient Real-Time Task Scheduling on CPU-GPU Hybrid Clusters", IEEE INFOCOM 2017, 9 pages.
CN 201711289667.8—Office Action, mailed Jun. 3, 2020, 18 pages. (no English translation).
Feng, et. al., "Applicatin of Neural Network in Image Processing", Information and Control, vol. 32, No. 4, Aug. 2003, 8 pages.
CN201711029543.6—First Office Action mailed on Mar. 28, 2023, 11 pages. (With Brief English Translations).
CN201711118938.3—First Office Action mailed on Mar. 13, 2023, 7 pages.(With Brief English Explanation).
KR 20197037574—Written Decision on Registration, mailed on Aug. 8, 2022, 04 pages.
KR20197023878—Written Decision on Registration, mailed on Aug. 8, 2022, 04 pages.
KR20197037566—Written Decision on Registration, mailed on Aug. 8, 2022, 7 pages.
EP 19215858.2—Communication pursuant to Article 94(3) EPC, mailed Apr. 21, 2022, 12 pages.
KR 1020197023878 Office Action, mailed Feb. 9, 2022, 13 pages, (With English translation).
KR 1020197037566 Office Action, mailed Feb. 11, 2022, 12 pages, (With English translation).
KR 1020197037574 Office Action, mailed Feb. 21, 2022, 22 pages, (With English translation).

* cited by examiner

PROCESSING METHOD AND DEVICE, OPERATION METHOD AND DEVICE

CROSS REFERENCE TO RELATED APPLICATIONS

This application is a continuation of U.S. patent application Ser. No. 16/528,624 filed Aug. 1, 2019, which is a continuation of U.S. patent application Ser. No. 16/482,710 filed Jul. 31, 2019. The contents of each of the above-captioned patent applications are hereby expressly incorporated herein by reference in their entireties.

TECHNICAL FIELD

The disclosure relates to the field of data processing, and particularly to a processing method and device, an operation method and device.

BACKGROUND

Neural networks have been successfully applied. However, lots of parameters and large-scale computation of a neural network become a huge challenge to neural network application. On one hand, lots of parameters make a very high requirement on a storage capacity and also result in high memory access energy consumption. On the other hand, large-scale computation makes a very high requirement on design of a computation unit and also results in high computation energy consumption. Therefore, how to reduce parameters and computation amount of a neural network becomes a problem urgent to be solved.

SUMMARY

The application is intended to provide a processing method and device and an operation method and device, so as to solve at least one of the above-mentioned technical problems.

An aspect of the application may provide a processing method including:
quantifying weights and input neurons respectively, and a weight dictionary, a weight codebook, a neuron dictionary, and a neuron codebook are determined; and
determining a computational codebook according to the weight codebook and the neuron codebook.

In one of embodiments of the application, quantifying the weights may include the following:
grouping the weights, adopting a clustering algorithm to perform a clustering operation on the weights of each group to divide the weights of each group into m types, in which m may indicate a positive integer and the weights of each type correspond to a weight index, and determining the weight dictionary, where the weight dictionary may include weight positions and weight indices, and the weight positions refer to positions of the weights in a neural network structure; and
replacing all the weights of each type with a central weight, and determining the weight codebook, where the weight codebook may include the weight indices and the central weights.

An embodiment of the application, quantifying the input neurons may include the following:
dividing the input neurons into p segments, where each segment of the input neurons corresponds to a neuron range and a neuron index, and determining the neuron dictionary, where p is a positive integer; and
coding the input neurons, replacing all the input neurons of each segment with a central neuron, and determining the neuron codebook.

An embodiment of the application, determining the computational codebook may include the following:
determining the corresponding weight indices in the weight codebook according to the weights, and determining the central weights corresponding to the weights through the weight indices;
determining the corresponding neuron indices in the neuron codebook according to the input neurons, and determining the central neurons corresponding to the input neurons through the neuron indices; and
performing a computational operation on the central weights and the central neurons to obtain computational results, and combining the computational results into a matrix, such that the computational codebook is determined.

An embodiment of the application, the computational operation may include at least one of: addition, multiplication, and pooling, where pooling may include average pooling, maximum pooling, and median pooling.

An embodiment of the application, the method further may include the following: retraining the weights and the input neurons, and only retraining the weight codebook and the neuron codebook, keeping contents in the weight dictionary and the neuron dictionary unchanged, and adopting a back propagation algorithm for retraining.

An embodiment of the application, grouping the weights may include the following:
dividing into a group: dividing all the weights in a neural network into a group;
layer-type-based grouping: dividing the weights of all convolutional layers, the weights of all fully connected layers, and the weights of all long short-term memory (LSTM) network layers in the neural network each into a group respectively;
interlayer grouping: dividing the weights of one or more convolutional layers, the weights of one or more fully connected layers, and the weights of one or more LSTM network layers in the neural network into a group respectively; and
intra-layer grouping: segmenting the weights in a layer of the neural network, and dividing each segmented part into a group.

An embodiment of the application, the clustering algorithm may include K-means, K-medoids, Clara, and/or Clarans.

An embodiment of the application, a selection method for the central weight corresponding to each type may include: determining a value of $W_0$ if a cost function $J(w, w_0)$ is minimum, in which the value of $W_0$ may be the central weight,
where $$J(w, w_0) = \sum_{i=1}^{n}(w_i - w_0)^2, J(w, w_0)$$

is the cost function, W refers to all the weights of the type, $W_0$ is the central weight, n is the count of all the weights of the type, $W_i$ is the $i^{th}$ weight of the type, $1 \leq i \leq n$ and i is a positive integer.

Another aspect of the application disclosure provides a processing device including:

a memory configured to store an computation instruction; and a processor configured to perform the computation instruction stored in the memory, where the computation instruction is performed for operations according to the abovementioned processing method.

An embodiment of the application, the computation instruction is a binary number and may include an operation code and an address code, the operation code indicates an operation to be performed by the processor, and the address code indicates an address of data participating in the operation and read by the processor from the memory.

Another aspect of the application provides an operation device including:

an instruction control unit configured to decode a received instruction and generate lookup control information; and a lookup table unit configured to look output neurons up in a computational codebook according to the lookup control information, a weight dictionary, a neuron dictionary, weights, and input neurons.

An embodiment of the application, the weight dictionary may include weight positions and weight indices; the neuron dictionary may include the input neurons and neuron indices; the computational codebook may include the weight indices, the neuron indices, and computational results of the input neurons and the weights.

An embodiment of the application, the operation device may also include:

a preprocessing unit configured to preprocess input information which is externally input to obtain the weights, the input neurons, the instruction, the weight dictionary, the neuron dictionary, and the computational codebook;

a storage unit configured to store the input neurons, the weights, the weight dictionary, the neuron dictionary, the computational codebook, and the instruction and to receive the output neurons;

a cache unit configured to cache the instruction, the input neurons, the weights, the weight indices, the neuron indices, and the output neurons; and a direct memory access (DMA) configured to read and write data or instructions between the storage unit and the cache unit.

An embodiment of the application, the cache unit may include:

an instruction cache configured to cache the instruction and output the cached instruction to the instruction control unit;

a weight cache configured to cache the weights;

an input neuron cache configured to cache the input neurons; and an output neuron cache configured to cache the output neurons output by the lookup table unit.

An embodiment of the application, the cache unit may also include:

a weight index cache configured to cache the weight indices; and a neuron index cache configured to cache the neuron indices.

An embodiment of the application, if the input information which is externally input is preprocessed, the preprocessing unit may be configured for segmentation, Gaussian filtering, binarization, regularization, and/or normalization.

An embodiment of the application, the lookup table unit may include:

a multiplication lookup table configured to perform a table lookup operation mult_lookup, according to an input weight index in1 and an neuron index in2, through the multiplication lookup table to complete a multiplication operation over a central weight data1 corresponding to the weight index and a central neuron data2 corresponding to the neuron index, for example, the multiplication lookup table performs a table lookup operation out=mult_lookup(in1,in2) to realize a multiplication function out=data1*data2; and/or an addition lookup table configured to perform a table lookup operation add_lookup through a step-by-step addition lookup table according to an input index in to complete an addition operation over central data data corresponding to the index, where in and data are vectors with lengths of N and N is a positive integer, for example, the addition lookup table performs a table lookup operation out=add_lookup(in) to realize an addition function out=data[1]+data[2]+ . . . +data[N]; and/or to perform a table lookup operation on the input weight index in1 and the neuron index in2 through the addition lookup table to complete an addition operation over a central weight data1 corresponding to the weight index and a central neuron data2 corresponding to the neuron index, for example, the addition lookup table performs a table lookup operation out=add_lookup(in1, in2) to realize an addition function out=data1+data2; and/or a pooling lookup table configured to perform a pooling operation on the central data data corresponding to the input index in, for example, the pooling lookup table performs a table lookup operation out=pool_lookup(in) to complete a pooling operation out=pool(data), where the pooling operation may include average pooling, maximum pooling, and median pooling.

An embodiment of the application, the instruction is a neural network-dedicated instruction, and the neural network-dedicated instruction may include:

a control instruction configured to control a neural network performing process;

a data transfer instruction configured to complete data transfer between different storage media, a data format including a matrix, a vector, and a scalar;

a computational instruction configured to complete arithmetic operation of the neural network and including a matrix computation instruction, a vector computation instruction, a scalar computation instruction, a convolutional neural network computation instruction, a fully connected neural network computation instruction, a pooling neural network computation instruction, a Restricted Boltzmann Machine (RBM) neural network computation instruction, a Local Response Normalization (LRN) neural network computation instruction, a Local Contrast Normalization (LCN) neural network computation instruction, an LSTM neural network computation instruction, a Recurrent Neural Networks (RNN) computation instruction, a rectified linear unit (ReLU) neural network computation instruction, a parametric rectified linear unit (PReLU) neural network computation instruction, a sigmoid neural network computation instruction, a tanh neural network computation instruction, and a maxout neural network computation instruction; and a logical instruction including a vector logical operation instruction and a scalar logical operation instruction configured to complete logical operation of the neural network.

An embodiment of the application, the neural network-dedicated instruction may include at least one Cambricon instruction which may include an operation code and an operand, and the Cambricon instruction may include:

a Cambricon control instruction configured to control the neural network performing process, the Cambricon control instruction including a jump instruction and a conditional branch instruction;

a Cambricon data transfer instruction configured to complete data transfer between different storage media, including a load instruction, a store instruction, and a move instruction, where the load instruction may be configured to load data from a main memory to a cache, the store instruction may be configured to store the data from the cache to the main memory, and the move instruction may be configured to move the data between the cache and another cache, the cache and a register, or the register and another register;

a Cambricon computational instruction configured to complete the arithmetic operation of the neural network, including a Cambricon matrix computation instruction, a Cambricon vector computation instruction, and a Cambricon scalar computation instruction, where the Cambricon matrix computation instruction may be configured to complete matrix computation in the neural network, including matrix multiply vector computation, vector multiply matrix computation, matrix multiply scalar computation, outer product computation, matrix add matrix computation, and matrix subtract matrix computation, the Cambricon vector computation instruction may be configured to complete vector computation in the neural network, including vector basic operations, vector transcendental functions computation, dot product computation, random vector generator computation, and computation of maximum/minimum of a vector, and the Cambricon scalar computation instruction may be configured to complete scalar computation in the neural network, including scalar basic operations, and scalar transcendental functions computation; and a Cambricon logical instruction configured for the logical operation of the neural network, including a Cambricon vector logical operation instruction and a Cambricon scalar logical operation instruction, where the Cambricon vector logical operation instruction may be configured for vector compare computation, vector logical operations, and vector greater than merge computation, in which the vector logical operations may include AND, OR, and NOT; and the Cambricon scalar logical operation instruction may be configured for scalar compare computation and scalar logical operations.

An embodiment of the application, the Cambricon data transfer instruction may support one or more of the following data organization manners: the matrix, the vector, and the scalar; the vector basic operations may include vector addition, subtraction, multiplication, and division; the vector transcendental functions refer to functions which do not meet any polynomial equations taking polynomials as coefficients, and include an exponential function, a logarithmic function, a trigonometric function, and an anti-trigonometric function; the scalar basic operations include scalar addition, subtraction, multiplication, and division; the scalar transcendental functions refer to functions which do not meet any polynomial equations taking polynomials as coefficients, and include an exponential function, a logarithmic function, a trigonometric function, and an anti-trigonometric function; the vector compare computation may include greater than, smaller than, equal to, more than or equal to, less than or equal to, and unequal to; the vector logical operations include AND, OR, and NOT; the scalar compare computation may include greater than, smaller than, equal to, more than or equal to, less than or equal to, and unequal to; the scalar logical operations include AND, OR, and NOT.

Another aspect of the application provides another operation method, which may include:

receiving weights, input neurons, an instruction, a weight dictionary, a neuron dictionary, and a computational codebook;

decoding the instruction, and determining lookup control information; and looking up output neurons in the computational codebook according to the lookup control information, the weights, the weight dictionary, the neuron dictionary, and the input neurons.

An embodiment of the application, the weight dictionary may include weight positions and weight indices; the neuron dictionary may include the input neurons and neuron indices; and the computational codebook may include the weight indices, the neuron indices, and computational results of the weights and the input neurons.

An embodiment of the application, looking up the output neurons in the computational codebook according to the lookup control information, the weights, the weight dictionary, the neuron dictionary, and the input neurons may include the following:

determining the neuron ranges, according to the weights, the input neurons, the weight dictionary, and the neuron dictionary, to determine the neuron indices in the neuron dictionary, and determining the weight positions to determine the weight indices in the weight dictionary; and looking up the computational results in the computational codebook according to the weight indices and the neuron indices to determine the output neurons.

An embodiment of the application, the computational results include a result of at least one of the following computational operations: addition, multiplication, and pooling, where pooling may include average pooling, maximum pooling, and median pooling.

An embodiment of the application, before receiving the weights, the input neurons, the instruction, the weight dictionary, the neuron dictionary, and the computational codebook, the method may also include the following: preprocessing an input information which is externally input to obtain the weights, the input neurons, the instruction, the weight dictionary, the neuron dictionary, and the computational codebook; and after receiving the weights, the input neurons, the instruction, the weight dictionary, the neuron dictionary, and the computational codebook, the method may also include the following: storing the weights, the input neurons, the instruction, the weight dictionary, the neuron dictionary, and the computational codebook, receiving the output neurons, and caching the instruction, the input neurons, the weights, and the output neurons.

An embodiment of the application, after receiving the weights, the input neurons, the instruction, the weight dictionary, the neuron dictionary, and the computational codebook, the method may further include the following: caching the weight indices and the neuron indices.

An embodiment of the application, preprocessing may include segmentation, Gaussian filtering, binarization, regularization, and/or normalization.

An embodiment of the application, the instruction is a neural network-dedicated instruction, and the neural network-dedicated instruction may include:
- a control instruction configured to control a neural network performing process;
- a data transfer instruction configured to complete data transfer between different storage media, in which the data format of data may include a matrix, a vector, and a scalar;
- a computational instruction configured to complete arithmetic operation of the neural network and including a matrix computation instruction, a vector computation instruction, a scalar computation instruction, a convolutional neural network computation instruction, a fully connected neural network computation instruction, a pooling neural network computation instruction, an RBM neural network computation instruction, an LRN neural network computation instruction, an LCN neural network computation instruction, an LSTM neural network computation instruction, an RNN computation instruction, an ReLU neural network computation instruction, a PReLU neural network computation instruction, a sigmoid neural network computation instruction, a tanh neural network computation instruction, and a maxout neural network computation instruction; and
- a logical instruction configured to complete logical operation of the neural network and including a vector logical operation instruction and a scalar logical operation instruction.

An embodiment of the application, the neural network-dedicated instruction may include at least one Cambricon instruction, the Cambricon instruction may include an operation code and an operand, and the Cambricon instruction may include:
- a Cambricon control instruction configured to control the neural network performing process, the Cambricon control instruction including a jump instruction and a conditional branch instruction;
- a Cambricon data transfer instruction configured to complete data transfer between different storage media and including a load instruction, a store instruction, and a move instruction, where the load instruction may be configured to load data from a main memory to a cache, the store instruction may be configured to store the data from the cache to the main memory, and the move instruction may be configured to move the data between the cache and another cache, the cache and a register, or the register and another register;
- a Cambricon computational instruction configured to complete the arithmetic operation of the neural network and including a Cambricon matrix computation instruction, a Cambricon vector computation instruction, and a Cambricon scalar computation instruction, where the Cambricon matrix computation instruction may be configured to complete matrix computation in the neural network, including matrix multiply vector computation, vector multiply matrix computation, matrix multiply scalar computation, outer product computation, matrix add matrix computation and matrix subtract matrix computation, the Cambricon vector computation instruction may be configured to complete vector computation in the neural network, including vector basic operations, vector transcendental functions computation, dot product computation, random vector generator computation, and computation of maximum/minimum of a vector, and the Cambricon scalar computation instruction may be configured to complete scalar computation in the neural network, including scalar basic operations, and scalar transcendental functions; and
- a Cambricon logical instruction configured for the logical operation of the neural network, the Cambricon logical instruction including a Cambricon vector logical operation instruction and a Cambricon scalar logical operation instruction, where the Cambricon vector logical operation instruction may be configured for vector compare computation, vector logical operations, and vector greater than merge computation, in which the vector logical operations include AND, OR, and NOT, the Cambricon scalar logical operation instruction may be configured for scalar compare computation and scalar logical operations.

An embodiment of the application, the Cambricon data transfer instruction supports one or more of the following data organization manners: the matrix, the vector, and the scalar; the vector basic operations may include vector addition, subtraction, multiplication, and division; the vector transcendental functions refer to functions which do not meet any polynomial equations taking polynomials as coefficients, and include an exponential function, a logarithmic function, a trigonometric function, and an anti-trigonometric function; the scalar basic operations may include scalar addition, subtraction, multiplication, and division; the scalar transcendental functions refer to functions which do not meet any polynomial equations taking polynomials as coefficients, and include an exponential function, a logarithmic function, a trigonometric function, and an anti-trigonometric function; the vector compare computation may include greater than, smaller than, equal to, more than or equal to, less than or equal to, and unequal to; the vector logical operations include AND, OR, and NOT; the scalar compare computation may include greater than, smaller than, equal to, more than or equal to, less than or equal to, and unequal to; the scalar logical operations include AND, OR, and NOT.

Another aspect of the application provides another operation device, which may include:
- an instruction control unit configured to decode a received instruction and generate lookup control information; and
- a lookup table unit configured to look output neurons up in a computational codebook according to the lookup control information and a received weight dictionary, neuron dictionary, computational codebook, weights, and input neurons.

An embodiment of the application, the weight dictionary may include weight positions and weight indices; the neuron dictionary may include the input neurons and neuron indices; and the computational codebook may include the weight indices, the neuron indices, and computational results of the input neurons and the weights.

An embodiment of the application, the operation device may further include:
- a preprocessing unit configured to preprocess input information which is externally input to obtain the weights, the input neurons, the instruction, the weight dictionary, the neuron dictionary, and the computational codebook;
- a storage unit configured to store the input neurons, the weights, the weight dictionary, the neuron dictionary, the computational codebook, and the instruction and to receive the output neurons;

a cache unit configured to cache the instruction, the input neurons, the weights, the weight indices, the neuron indices, and the output neurons; and a DMA configured to read and write data or instructions between the storage unit and the cache unit.

An embodiment of the application, the cache unit may include:

an instruction cache configured to cache the instruction and output the cached instruction to the instruction control unit;

a weight cache configured to cache the weights;

an input neuron cache unit configured to cache the input neurons; and an output neuron cache configured to cache the output neurons output by the lookup table unit.

An embodiment of the application, the cache unit may further include:

a weight index cache configured to cache the weight indices; and a neuron index cache configured to cache the neuron indices.

An embodiment of the application, the preprocessing unit preprocessing the input information which is externally input may include segmentation, Gaussian filtering, binarization, regularization, and/or normalization.

An embodiment of the application, the lookup table unit may include:

a multiplication lookup table configured to input a weight index in1 and a neuron index in2, and complete a multiplication operation on a central weight data1 corresponding to the weight index and a central neuron data2 corresponding to the neuron index through the table lookup operation mult_lookup, for example, the multiplication lookup table uses the table lookup operation out=mult_lookup(in1, in2) to complete the multiplication function out=data1*data2; and/or an addition lookup table configured to perform a table lookup operation add_lookup through a step-by-step addition lookup table according to an input index in to complete an addition operation on central data data corresponding to the index, where in and data are vectors with lengths of N and N is a positive integer, for example, the addition lookup table performs a table lookup operation out=add_lookup(in) to complete an addition function out=data[1]+data[2]+ . . . +data[N]; and/or perform a table lookup operation on the input weight index in1 and the neuron index in2 through the addition lookup table to complete an addition operation on a central weight data1 corresponding to the weight index and a central neuron data2 corresponding to the neuron index, for example, the addition lookup table performs a table lookup operation out=add_lookup(in1, in2) to complete an addition function out=data1+data2; and/or a pooling lookup table configured to perform a pooling operation on the central data data corresponding to the input index, for example, the pooling lookup table performs a table lookup operation out=pool_lookup(in) to complete a pooling operation out=pool(data), where the pooling operation may include average pooling, maximum pooling, and median pooling.

An embodiment of the application, the instruction is a neural network-dedicated instruction, and the neural network-dedicated instruction may include:

a control instruction configured to control a neural network performing process;

a data transfer instruction configured to complete data transfer between different storage media, a data format including a matrix, a vector, and a scalar;

an computation instruction configured to complete arithmetic operation of a neural network and including a matrix computation instruction, a vector computation instruction, a scalar computation instruction, a convolutional neural network computation instruction, a fully connected neural network computation instruction, a pooling neural network computation instruction, an RBM neural network computation instruction, an LRN neural network computation instruction, an LCN neural network computation instruction, an LSTM neural network computation instruction, an RNN computation instruction, an ReLU neural network computation instruction, a PReLU neural network computation instruction, a sigmoid neural network computation instruction, a tanh neural network computation instruction, and a maxout neural network computation instruction; and a logical instruction configured to complete logical operation of the neural network including a vector logical operation instruction and a scalar logical operation instruction.

An embodiment of the application, the neural network-dedicated instruction may include at least one Cambricon instruction, the Cambricon instruction may include an operation code and an operand, and the Cambricon instruction may include:

a Cambricon control instruction configured to control the performing process, the Cambricon control instruction including a jump instruction and a conditional branch instruction;

a Cambricon data transfer instruction configured to complete data transfer between different storage media, including a load instruction, a store instruction, and a move instruction, where the load instruction may be configured to load data from a main memory to a cache, the store instruction may be configured to store the data from the cache to the main memory, and the move instruction may be configured to move the data between the cache and another cache, the cache and a register, or the register and another register;

a Cambricon computational instruction configured to complete the arithmetic operation of the neural network and including a Cambricon matrix computation instruction, a Cambricon vector computation instruction, and a Cambricon scalar computation instruction, where the Cambricon matrix computation instruction may be configured to complete matrix computation in the neural network, including matrix multiply vector computation, vector multiply matrix computation, matrix multiply scalar computation, outer product computation, matrix add matrix computation, and matrix subtract matrix computation, the Cambricon vector computation instruction may be configured to complete vector computation in the neural network, including vector basic operations, vector transcendental functions computation, dot product computation, random vector generator computation, and computation of maximum/minimum of a vector, and the Cambricon scalar computation instruction may be configured to complete scalar computation in the neural network, including scalar basic operations, and scalar transcendental functions computation; and a Cambricon logical instruction configured for the logical operation of the neural network, the Cambricon logical instruction including a Cambricon vector logical operation instruction and a Cambricon scalar logical operation instruction, where the Cambricon vector logical operation instruction may be configured for vector compare computation, vector logical operations, and vector greater than merge computation, in which the vector logical operations include AND, OR, and NOT, the Cambricon scalar logical operation instruction may be configured for scalar compare computation and scalar logical operations.

An embodiment of the application, the Cambricon data transfer instruction supports one or more of the following data organization manners: the matrix, the vector, and the scalar; the vector basic operations may include vector addition, subtraction, multiplication, and division; the vector transcendental functions refer to functions which do not meet any polynomial equations taking polynomials as coefficients, and include an exponential function, a logarithmic function, a trigonometric function, and an anti-trigonometric function; the scalar basic operations may include scalar addition, subtraction, multiplication, and division; the scalar transcendental functions refer to functions which do not meet any polynomial equations taking polynomials as coefficients, and include an exponential function, a logarithmic function, a trigonometric function, and an anti-trigonometric function; the vector compare computation may include greater than, smaller than, equal to, more than or equal to, less than or equal to, and unequal to; the vector logical operations include AND, OR, and NOT; the scalar compare computation may include greater than, smaller than, equal to, more than or equal to, less than or equal to, and unequal to; the scalar logical operations include AND, OR, and NOT.

Another aspect of the application provides another processing method, which may include:
  receiving weights, input neurons, an instruction, a weight dictionary, a neuron dictionary, and a computational codebook;
  decoding the instruction, and determining lookup control information is; and
  looking up output neurons in the computational codebook according to the lookup control information, the weights, the weight dictionary, the neuron dictionary, and the input neurons.

An embodiment of the application, the weight dictionary may include weight positions and weight indices; the neuron dictionary may include the input neurons and neuron indices; and the computational codebook may include the weight indices, the neuron indices, and computational results of the weights and the input neurons.

An embodiment of the application, looking up the output neurons in the computational codebook according to the lookup control information, the weights, and the input neurons may include the following:
  determining the neuron ranges, according to the weights, the input neurons, the weight dictionary, and the neuron dictionary, to determine the neuron indices in the neuron dictionary, and determining the weight positions to determine the weight indices in the weight dictionary; and looking up the computational results in the computational codebook according to the weight indices and the neuron indices to determine the output neurons.

An embodiment of the application, the computational results include a result of at least one of the following computational operations: addition, multiplication, and pooling, where pooling may include average pooling, maximum pooling, and median pooling.

An embodiment of the application, before receiving the weights, the input neurons, the instruction, the weight dictionary, the neuron dictionary, and the computational codebook, the method may further include the following: preprocessing input information which is externally input to obtain the weights, the input neurons, the instruction, the weight dictionary, the neuron dictionary, and the computational codebook; and
  after receiving the weights, the input neurons, the instruction, the weight dictionary, the neuron dictionary and the computational codebook, the method may further include the following: storing the weights, the input neurons, the instruction, the weight dictionary, the neuron dictionary, and the computational codebook, receiving the output neurons, and caching the instruction, the input neurons, the weights, and the output neurons.

An embodiment of the application, after receiving the weights, the input neurons, the instruction, the weight dictionary, the neuron dictionary, and the computational codebook, the method may further include the following: caching the weight indices and the neuron indices.

An embodiment of the application, preprocessing may include segmentation, Gaussian filtering, binarization, regularization, and/or normalization.

An embodiment of the application, the instruction is a neural network-dedicated instruction, and the neural network-dedicated instruction may include:
  a control instruction configured to control a neural network performing process;
  a data transfer instruction configured to complete data transfer between different storage media, a data format including a matrix, a vector, and a scalar;
  an computation instruction configured to complete arithmetic operation of a neural network and including a matrix computation instruction, a vector computation instruction, a scalar computation instruction, a convolutional neural network computation instruction, a fully connected neural network computation instruction, a pooling neural network computation instruction, an RBM neural network computation instruction, an LRN neural network computation instruction, an LCN neural network computation instruction, an LSTM neural network computation instruction, an RNN computation instruction, an ReLU neural network computation instruction, a PReLU neural network computation instruction, a sigmoid neural network computation instruction, a tanh neural network computation instruction, and a maxout neural network computation instruction; and
  a logical instruction configured to complete logical operation of the neural network and including a vector logical operation instruction and a scalar logical operation instruction.

An embodiment of the application, the neural network-dedicated instruction may include at least one Cambricon instruction, the Cambricon instruction may include an operation code and an operand, and the Cambricon instruction may include:
  a Cambricon control instruction configured to control the performing process, the Cambricon control instruction including a jump instruction and a conditional branch instruction;
  a Cambricon data transfer instruction configured to complete data transfer between different storage media and including a load instruction, a store instruction and a move instruction, where the load instruction may be configured to load data from a main memory to a cache, the store instruction may be configured to store the data from the cache to the main memory, and the move instruction may be configured to move the data between the cache and another cache or the cache and a register or the register and another register;

a Cambricon computational instruction configured to complete the arithmetic operation of the neural network and including a Cambricon matrix computation instruction, a Cambricon vector computation instruction, and a Cambricon scalar computation instruction, where the Cambricon matrix computation instruction may be configured to complete matrix computation in the neural network, including matrix multiply vector computation, vector multiply matrix computation, matrix multiply scalar computation, outer product computation, matrix add matrix computation, and matrix subtract matrix computation, the Cambricon vector computation instruction may be configured to complete vector computation in the neural network, including vector basic operations, vector transcendental functions computation, dot product computation, random vector generator computation, and computation of maximum/minimum of a vector, and the Cambricon scalar computation instruction may be configured to complete scalar computation in the neural network, including scalar basic operations and scalar transcendental functions computation; and a Cambricon logical instruction configured for the logical operation of the neural network, the Cambricon logical instruction including a Cambricon vector logical operation instruction and a Cambricon scalar logical operation instruction, where the Cambricon vector logical operation instruction may be configured for vector compare computation, vector logical operations, and vector greater than merge computation, in which the vector logical operations include AND, OR, and NOT, the Cambricon scalar logical operation instruction may be configured for scalar compare computation and scalar logical operations.

An embodiment of the application, the Cambricon data transfer instruction supports one or more of the following data organization manners: the matrix, the vector, and the scalar; the vector basic operations may include vector addition, subtraction, multiplication, and division; the vector transcendental functions refer to functions which do not meet any polynomial equations taking polynomials as coefficients, and include an exponential function, a logarithmic function, a trigonometric function, and an anti-trigonometric function; the scalar basic operations may include scalar addition, subtraction, multiplication, and division; the scalar transcendental functions refer to functions which do not meet any polynomial equations taking polynomials as coefficients, and include an exponential function, a logarithmic function, a trigonometric function, and an anti-trigonometric function; the vector compare computation may include greater than, smaller than, equal to, more than or equal to, less than or equal to, and unequal to; the vector logical operations include AND, OR, and NOT; the scalar compare computation may include greater than, smaller than, equal to, more than or equal to, less than or equal to, and unequal to; the scalar logical operations include AND, OR, and NOT.

Neural networks have been successfully applied. However, large-scale neural network parameters make a very high requirement on storage. On one hand, the large-scale neural network parameters require a huge storage capacity. On the other hand, access to massive neural network data may result in huge memory access energy consumption.

At present, a memory storing neural network parameters is an error correcting code (ECC) memory. The ECC memory may correct an error occurring if data is read, but the ECC memory may also bring an additional storage capacity overhead and memory access power consumption overhead. A neural network algorithm has a certain fault-tolerant capability. Storing all parameters of a neural network in an ECC memory ignores fault tolerance of the neural network and results in an additional storage overhead, computation overhead, and memory access overhead. Therefore, how to select a memory suitable for neural network processing in combination with a fault-tolerant capability of a neural network is a problem urgent to be solved.

Another aspect of the application provides a storage device, which may include:

an accurate storage unit configured to store important bits of data; and an inaccurate storage unit configured to store unimportant bits of the data.

An embodiment of the application, the accurate storage unit adopts an ECC memory, and the inaccurate storage unit adopts a non-ECC memory.

An embodiment of the application, the data is a neural network parameter, including an input neuron, a weight, and an output neuron. The accurate storage unit may be configured to store important bits of the input neuron, important bits of the output neuron, and important bits of the weight; and the inaccurate storage unit may be configured to store unimportant bits of the input neuron, unimportant bits of the output neuron, and unimportant bits of the weight.

An embodiment of the application, the data may include floating-point type data and fixed-point type data. Sign bits and bits of an exponent part of the floating point type data are determined as the important bits, and bits of a base part are determined as the unimportant bits. Sign bits and first x bits of numerical part of the fixed point type data include the important bits, and left bits of the numerical part include the unimportant bits, where x is a positive integer more than or equal to zero and smaller than m, and m is the total number of bits of the data.

An embodiment of the application, the ECC memory may include an ECC check Dynamic Random Access Memory (DRAM) and an ECC check Static Random Access Memory (SRAM); and the ECC check SRAM adopts a 6T SRAM, a 4T SRAM, or a 3T SRAM.

An embodiment of the application, the non-ECC memory may include a non-ECC check DRAM and a non-ECC check SRAM; and the non-ECC check SRAM adopts a 6T SRAM, a 4T SRAM, or a 3T SRAM.

An embodiment of the application, a storage unit storing each bit in the 6T SRAM may include six Metal Oxide Semiconductor (MOS) transistors; a storage unit storing each bit in the 4T SRAM may include four MOS transistors; and a storage unit storing each bit in the 3T SRAM may include three MOS transistors.

An embodiment of the application, the four MOS transistors include a first MOS transistor, a second MOS transistor, a third MOS transistor, and a fourth MOS transistor. The first MOS transistor and the second MOS transistor are configured for gating, and the third MOS transistor and the fourth MOS transistor are configured for storage, where a gate of the first MOS transistor is electrically connected with a word line (WL) and a source of the first MOS transistor is electrically connected with a bit line (BL); a gate of the second MOS transistor is electrically connected with the WL and a source of the second MOS transistor is electrically connected with another BL; a gate of the third MOS transistor is connected with a source of the fourth MOS transistor and a drain of the second MOS transistor and is connected with a working voltage source through a resistor R2, and a drain of the third MOS transistor is grounded; a gate of the fourth MOS transistor is connected with a source of the third MOS transistor and a drain of the first MOS transistor, and is connected with the working voltage source through a resistor R1, and a drain of the fourth MOS transistor is grounded; the WL may be configured to control gated access to the storage unit, and the BL may be configured to read and write the storage unit.

An embodiment of the application, the three MOS transistors include a first MOS transistor, a second MOS transistor, and a third MOS transistor. The first MOS transistor may be configured for gating, and the second MOS transistor and the third MOS transistor are configured for storage, where a gate of the first MOS transistor is electrically connected with a WL and a source of the first MOS transistor is electrically connected with a BL; a gate of the second MOS transistor is connected with a source of the third MOS transistor and is connected with the working voltage source through the resistor R2, and a drain of the second MOS transistor is grounded; a gate of the third MOS transistor is connected with a source of the second MOS transistor and a drain of the first MOS transistor and is connected with the working voltage source through the resistor R1, and a drain of the third MOS transistor is grounded; and the WL may be configured to control gated access to the storage unit, and the BL may be configured to read and write the storage unit.

Another aspect of the application provides a data processing device, which may include:

a computation unit, an instruction control unit, and the abovementioned storage device, where the storage device may be configured to receive an input instruction and a computational parameter, to store the instruction and important bits of the computational parameter in an accurate storage unit, and to store unimportant bits of the computational parameter in an inaccurate storage unit; the instruction control unit may be configured to receive the instruction stored in the storage device, to decode the instruction, and to generate control information; and the computation unit may be configured to receive the computational parameter stored in the storage device, to perform computation according to the control information, and to transfer a computational result to the storage device.

An embodiment of the application, the computation unit is a neural network processor.

An embodiment of the application, the computational parameter is a neural network parameter. The computation unit may be configured to receive an input neuron and a weight stored in the storage device, to complete neural network computation according to the control information so as to obtain an output neuron, and to transfer the output neuron to the storage device.

An embodiment of the application, the computation unit may be configured to receive important bits of an input neuron and important bits of a weight stored in the storage device for computation, or the computation unit may be configured to receive the important bits and the unimportant bits of the input neuron, as well as the important bits and the unimportant bits of the weight, and to splice the complete input neuron and weight for computation.

An embodiment of the application, the data processing device may further include: an instruction cache, arranged between the storage device and the instruction control unit and configured to store a dedicated instruction; an input neuron hierarchical cache, arranged between the storage device and the computation unit and configured to cache the input neuron, the input neuron hierarchical cache including an accurate input neuron cache and an inaccurate input neuron cache; a weight hierarchical cache, arranged between the storage device and the computation unit and configured to cache the weight, the weight hierarchical cache including an accurate weight cache and an inaccurate weight cache; and an output neuron hierarchical cache, arranged between the storage device and the computation unit and configured to cache the output neuron, the output neuron hierarchical cache including an accurate output neuron cache and an inaccurate output neuron cache.

An embodiment of the application, the data processing device may further include a DMA configured to read and write data or instructions from/into the storage device, the instruction cache, the weight hierarchical cache, the input neuron hierarchical cache, and the output neuron hierarchical cache.

An embodiment of the application, the instruction cache, the input neuron hierarchical cache, the weight hierarchical cache, and the output neuron hierarchical cache adopt 4T SRAMs or 3T SRAMs.

An embodiment of the application, the data processing device may further include a preprocessing module configured to preprocess input data and to transfer input data preprocessed to the storage device, and preprocessing may include segmentation, Gaussian filtering, binarization, regularization and normalization.

An embodiment of the application, the computation unit is a universal arithmetic processor.

Another aspect of the application provides an electronic device, which may include the abovementioned data processing device.

Another aspect of the application provides a storage method, which may include: accurately storing important bits of the data; and inaccurately storing unimportant bits of the data.

An embodiment of the application, accurately storing the important bits of the data may include: extracting the important bits of the data, and storing the important bits of the data in an ECC memory for accurate storage.

An embodiment of the application, inaccurately storing the unimportant bits in the data may include: extracting the unimportant bits of the data, and storing the unimportant bits of the data in a non-ECC memory for inaccurate storage.

An embodiment of the application, the data is a neural network parameter, including an input neuron, a weight, and an output neuron; important bits of the input neuron, important bits of the output neuron, and important bits of the weight are accurately stored; and unimportant bits of the input neuron, unimportant bits of the output neuron, and unimportant bits of the weight are inaccurately stored.

An embodiment of the application, the data may include floating point type data and fixed point type data; sign bits and bits of an exponent part of the floating point type data are determined as the important bits and bits of a base part are determined as the unimportant bits; sign bits and first x bits of numerical part of the fixed point type data include the important bits and left bits of the numerical part include the unimportant bits, where x is a positive integer more than or equal to zero and smaller than m, and m is the total number of bits of the parameter.

An embodiment of the application, the ECC memory may include an ECC check DRAM and an ECC check SRAM; and the ECC check SRAM adopts a 6T SRAM, a 4T SRAM, or a 3T SRAM.

An embodiment of the application, the non-ECC memory may include a non-ECC check DRAM and a non-ECC check SRAM; and the non-ECC check SRAM adopts a 6T SRAM, a 4T SRAM, or a 3T SRAM.

Another aspect of the application provides a data processing method, which may include:
receiving an instruction and a parameter, accurately storing the instruction and important bits of the parameter, and inaccurately storing unimportant bits of the parameter; receiving the instruction, decoding the instruction, and generating control information; and receiving the parameter, performing computation according to the control information, and storing a computational.

An embodiment of the application, the computation is neural network computation, and the parameter is a neural network parameter.

An embodiment of the application, receiving the parameter, performing the computation according to the control information, and storing the computational result may include: receiving an input neuron and a weight, completing the neural network computation according to the control information to obtain an output neuron, and storing or outputting the output neuron.

An embodiment of the application, receiving the input neuron and the weight, and completing the neural network computation according to the control information to obtain the output neuron may include: receiving important bits of the input neuron and important bits of the weight for computation; or receiving the important bits and unimportant bits of the input neuron, as well as the important bits and unimportant bits of the weight, and splicing the complete input neuron and weight for computation.

An embodiment of the application, the data processing method may further include: caching a dedicated instruction; accurately caching and inaccurately caching the input neuron; accurately caching and inaccurately caching the weight data; and accurately caching and inaccurately caching the output neuron.

An embodiment of the application, the computation is universal computation.

An embodiment of the application, before receiving the instruction and the parameter, the instruction and the important bits of the parameter are stored for accurate storage and the unimportant bits of the parameter are inaccurately stored; the data processing method may further include: preprocessing and storing input data, where preprocessing includes segmentation, Gaussian filtering, binarization, regularization, and normalization.

Another aspect of the application provides a storage unit, which is a 4T SRAM or a 3T SRAM, and may be configured to store neural network parameters.

An embodiment of the application, a storage unit storing each bit in the 4T SRAM may include four MOS transistors; and a storage unit storing each bit in the 3T SRAM may include three MOS transistors.

An embodiment of the application, the four MOS transistors include a first MOS transistor, a second MOS transistor, a third MOS transistor, and a fourth MOS transistor. The first MOS transistor and the second MOS transistor are configured for gating, and the third MOS transistor and the fourth transistor are configured for storage, where a gate of the first MOS transistor is electrically connected with a WL, and a source is electrically connected with a BL; a gate of the second MOS transistor is electrically connected with the WL and a source is electrically connected with another BL; a gate of the third MOS transistor is connected with a source of the fourth MOS transistor and a drain of the second MOS transistor and is connected with a working voltage source through a resistor R2, and a drain of the third MOS transistor is grounded; a gate of the fourth MOS transistor is connected with a source of the third MOS transistor and a drain of the first MOS transistor and is connected with the working voltage source through a resistor R1, and a drain of the fourth MOS transistor is grounded; the WL may be configured to control gated access to the storage unit, and the BL may be configured to read and write the storage unit.

An embodiment of the application, the three MOS transistors include a first MOS transistor, a second MOS transistor, and a third MOS transistor. The first MOS transistor may be configured for gating, and the second MOS transistor and the third MOS transistor are configured for storage, where a gate of the first MOS transistor is electrically connected with the WL and a source is electrically connected with the BL; a gate of the second MOS transistor is connected with a source of the third MOS transistor and is connected with the working voltage source through the resistor R2, and a drain of the second MOS transistor is grounded; a gate of the third MOS transistor is connected with a source of the second MOS transistor and a drain of the first MOS transistor and is connected with the working voltage source through the resistor R1, and a drain of the third MOS transistor is grounded. The WL may be configured to control gated access of the storage unit, and the BL may be configured to read and write the storage unit.

An embodiment of the application, the neural network parameter may include the input neuron, the weight, and the output neuron.

Along with increase of a working frequency and constant development of a semiconductor process, a problem about power consumption of a chip has become an important factor considered for a deep sub-nanometer integrated circuit. Dynamic voltage frequency scaling (DVFS) is a DVFS technology which is widely adopted for the field of semiconductors at present. The DVFS technology dynamically scales a running frequency and voltage of a chip (for the same chip, if the frequency is higher, a higher voltage is required), thereby achieving a purpose of saving energy. However, in related arts, there are no DVFS methods and corresponding device designs applied to intelligent chips, and it is impossible to complete advanced scaling over a voltage and a frequency of a chip by use of application scenario information.

Another aspect of the application provides a DVFS device, which may include:
an information acquisition unit configured to acquire working state information or application scenario information of a chip connected with the DVFS device in real time, in which the application scenario information may be information obtained by the chip through neural network operation or acquired by a sensor connected with the chip; and
a voltage frequency scaling unit configured to send voltage frequency scaling information to the chip according to the working state information or the application scenario information of the chip, in which the voltage frequency scaling information may be configured to instruct the chip to scale its working voltage or working frequency.

An embodiment of the application, the working state information of the chip may include an operating speed of the chip, the voltage frequency scaling information may include first voltage frequency scaling information, and the voltage frequency scaling unit may be configured to:

if the operating speed of the chip is greater than a target speed, send the first voltage frequency scaling information to the chip, in which the first voltage frequency scaling information may be configured to instruct the chip to decrease its working frequency or working voltage, and the target speed may be an operating speed of the chip if a user requirement is met.

An embodiment of the application, the chip may include at least a first unit and a second unit. Output data of the first unit is input data of the second unit. The working state information of the chip may include an operating speed of the first unit and an operating speed of the second unit. The voltage frequency scaling information may include second voltage frequency scaling information. The voltage frequency scaling unit may be further configured to:

in response to determining, according to the operating speed of the first unit and the operating speed of the second unit, that a running time of the first unit exceeds a running time of the second unit, send the second voltage frequency scaling information to the second unit, in which the second voltage frequency scaling information may be configured to instruct the second unit to decrease its working frequency or working voltage.

An embodiment of the application, the voltage frequency scaling information may include third voltage frequency scaling information, and the voltage frequency scaling unit is further configured to:

in response to determining, according to the operating speed of the first unit and the operating speed of the second unit, that the running time of the second unit exceeds the running time of the first unit, send the third voltage frequency scaling information to the first unit, in which the third voltage frequency scaling information may be configured to instruct the first unit to decrease its working frequency or working voltage.

An embodiment of the application, the chip may include at least N units. The working state information of the chip may include working state information of at least S units in the at least N units, in which N may be an integer larger than one and S may be an integer less than or equal to N. The voltage frequency scaling information may include fourth voltage frequency scaling information, and the voltage frequency scaling unit may be configured to:

in response to determining, according to the working state information of a unit A, that the unit A is in an idle state, send the fourth voltage frequency scaling information to the unit A, in which the fourth voltage frequency scaling information may be configured to instruct the unit A to decrease its working frequency or working voltage, where the unit A is any one of the at least S units.

An embodiment of the application, the voltage frequency scaling information may include fifth voltage frequency scaling information, and the voltage frequency scaling unit may be configured to:

in response to determining, according to the working state information of the unit A, that the unit A returns to a working state, send the fifth voltage frequency scaling information to the unit A, in which the fifth voltage frequency scaling information may be configured to instruct the unit A to increase its working voltage or working frequency.

An embodiment of the application, an application scenario of the chip is image recognition, the application scenario information may include the count of objects in an image to be recognized, the voltage frequency scaling information may include sixth voltage frequency scaling information, and the voltage frequency scaling unit may be configured to:

in response to determining that the count of the objects in the image to be recognized is smaller than a first threshold value, send the sixth voltage frequency scaling information to the chip, in which the sixth voltage frequency scaling information may be configured to instruct the chip to decrease its working voltage or working frequency.

An embodiment of the application, the application scenario information is object tag information, the voltage frequency scaling information may include seventh voltage frequency scaling information, and the voltage frequency scaling unit may be configured to:

in response to determining that the object tag information belongs to a preset object tag set, send the seventh voltage frequency scaling information to the chip, in which the seventh voltage frequency scaling information may be configured to instruct the chip to increase its working voltage or working frequency.

An embodiment of the application, the chip is applied to voice recognition, the application scenario information is a voice input rate, the voltage frequency scaling information may include eighth voltage frequency scaling information, and the voltage frequency scaling unit may be configured to:

if the voice input rate is lower than a second threshold value, send the eighth voltage frequency scaling information to the chip, in which the eighth voltage frequency scaling information may be configured to instruct the chip to decrease its working voltage or working frequency.

An embodiment of the application, the application scenario information is a keyword obtained by voice recognition performed by the chip, the voltage frequency scaling information may include ninth voltage frequency scaling information, and the voltage frequency scaling unit may be configured to:

if the keyword belongs to a preset keyword set, send the ninth voltage frequency scaling information to the chip, in which the ninth voltage frequency scaling information may be configured to instruct the chip to increase its working voltage or working frequency.

An embodiment of the application, the chip is applied to machine translation, the application scenario information may include a character input speed or a number of characters in an image to be translated, the voltage frequency scaling information may include tenth voltage frequency scaling information, and the voltage frequency scaling unit may be configured to:

if the character input speed is lower than a third threshold value or the count of the characters in the image to be translated is smaller than a fourth threshold value, send the tenth voltage frequency scaling information to the chip, in which the tenth voltage frequency scaling information may be configured to instruct the chip to decrease its working voltage or working frequency.

An embodiment of the application, the application scenario information is an external light intensity, the voltage frequency scaling information may include eleventh voltage frequency scaling information, and the voltage frequency scaling unit may be configured to:

if the external light intensity is lower than a fifth threshold value, send the eleventh voltage frequency scaling information to the chip, in which the eleventh voltage frequency scaling information may be configured to instruct the chip to decrease its working voltage or working frequency.

An embodiment of the application, the chip is applied to image retouching, the voltage frequency scaling information may include twelfth voltage frequency scaling information and thirteenth voltage frequency scaling information, and the voltage frequency scaling unit may be configured to:

if the application scenario information is a face image, send the twelfth voltage frequency scaling information to the chip, in which the twelfth voltage frequency scaling information may be configured to instruct the chip to decrease its working voltage, and if the application scenario information is not a face image, send the thirteenth voltage frequency scaling information to the chip, in which the thirteenth voltage frequency scaling information may be configured to instruct the chip to decrease its working voltage or working frequency.

Another aspect of the application provides a DVFS method, which may include that:

acquiring working state information or application scenario information of a chip connected with a DVFS device in real time, in which the application scenario information may be information obtained by the chip through neural network computation or acquired by a sensor connected with the chip; and sending voltage frequency scaling information to the chip according to the working state information or the application scenario information of the chip, in which the voltage frequency scaling information may be configured to instruct the chip to scale its working voltage or working frequency.

An embodiment of the application, the working state information of the chip may include an operating speed of the chip, the voltage frequency scaling information may include first voltage frequency scaling information, and sending the voltage frequency scaling information to the chip according to the working state information or the application scenario information of the chip may include that:

if the operating speed of the chip is greater than a target speed, sending the first voltage frequency scaling information to the chip, in which the first voltage frequency scaling information may be configured to instruct the chip to decrease its working frequency or working voltage and the target speed may be an operating speed of the chip if a user requirement is met.

An embodiment of the application, the chip may include at least a first unit and a second unit. Output data of the first unit is input data of the second unit. The working state information of the chip may include an operating speed of the first unit and an operating speed of the second unit. The voltage frequency scaling information may include second voltage frequency scaling information. The sending the voltage frequency scaling information to the chip according to the working state information or the application scenario information of the chip may further include:

if a running time of the first unit exceeds a running time of the second unit according to a running speed of the first unit and a running speed of the second unit, sending the second voltage frequency scaling information to the second unit, in which the second voltage frequency scaling information may be configured to instruct the second unit to decrease its working frequency or working voltage.

An embodiment of the application, the voltage frequency scaling information may include third voltage frequency scaling information, and sending the voltage frequency scaling information to the chip according to the working state information or the application scenario information of the chip may further include:

if a running time of the second unit exceeds a running time of the first unit according to a running speed of the first unit and a running speed of the second unit, sending the third voltage frequency scaling information to the first unit, in which the third voltage frequency scaling information may be configured to instruct the first unit to decrease its working frequency or working voltage.

An embodiment of the application, the chip may include at least N units, the working state information of the chip may include working state information of at least S units in the at least N units, in which N may be an integer larger than 1 and S may be an integer less than or equal to N. The voltage frequency scaling information may include fourth voltage frequency scaling information, and sending the voltage frequency scaling information to the chip according to the working state information or the application scenario information of the chip may further include:

according to the working state information of a unit A, in response to the unit A being determined to be in an idle state, sending the fourth voltage frequency scaling information to the unit A, in which the fourth voltage frequency scaling information may be configured to instruct the unit A to decrease its working frequency or working voltage, where the unit A is any one of the at least S units.

An embodiment of the application, the voltage frequency scaling information may include fifth voltage frequency scaling information, and sending the voltage frequency scaling information to the chip according to the working state information or the application scenario information of the chip may further include that:

according to the working state information of the unit A, in response to the unit A being determined to return to a working state, sending the fifth voltage frequency scaling information to the unit A, in which the fifth voltage frequency scaling information may be configured to instruct the unit A to increase its working voltage or working frequency.

An embodiment of the application, an application scenario of the chip is image recognition, the application scenario information is the count of objects in an image to be recognized, the voltage frequency scaling information may include sixth voltage frequency scaling information, and sending the voltage frequency scaling information to the chip according to the working state information or the application scenario information of the chip may further include:

in response to the count of the objects in the image to be recognized being determined to be smaller than a first threshold value, sending the sixth voltage frequency scaling information to the chip, in which the sixth voltage frequency scaling information may be configured to instruct the chip to decrease its working voltage or working frequency.

An embodiment of the application, the application scenario information is object tag information, the voltage frequency scaling information may include seventh voltage frequency scaling information, and sending the voltage frequency scaling information to the chip according to the working state information or the application scenario information of the chip may further include:

in response to the object tag information being determined to belong to a preset object tag set, sending the seventh voltage frequency scaling information to the chip, in which the seventh voltage frequency scaling information may be configured to instruct the chip to increase its working voltage or working frequency.

An embodiment of the application, the chip is applied to voice recognition, the application scenario information is a voice input rate, the voltage frequency scaling information may include eighth voltage frequency scaling information, and sending the voltage frequency scaling information to the chip according to the working state information or the application scenario information of the chip may further include:

if the voice input rate is lower than a second threshold value, sending the eighth voltage frequency scaling information to the chip, in which the eighth voltage frequency scaling information may be configured to instruct the chip to decrease its working voltage or working frequency.

An embodiment of the application, the application scenario information is a keyword obtained by voice recognition performed by the chip, the voltage frequency scaling information may include ninth voltage frequency scaling information, and sending the voltage frequency scaling information to the chip according to the working state information or the application scenario information of the chip may further include:

if the keyword belongs to a preset keyword set, sending the ninth voltage frequency scaling information to the chip, in which the ninth voltage frequency scaling information may be configured to instruct the chip to increase its working voltage or working frequency.

An embodiment of the application, the chip is applied to machine translation, the application scenario information is a character input speed or a number of characters in an image to be translated, the voltage frequency scaling information may include tenth voltage frequency scaling information, and sending the voltage frequency scaling information to the chip according to the working state information or the application scenario information of the chip may further include:

if the character input speed is lower than a third threshold value or the count of the characters in the image to be translated is smaller than a fourth threshold value, sending the tenth voltage frequency scaling information to the chip, in which the tenth voltage frequency scaling information may be configured to instruct the chip to decrease its working voltage or working frequency.

An embodiment of the application, the application scenario information is an external light intensity, the voltage frequency scaling information may include eleventh voltage frequency scaling information, and sending the voltage frequency scaling information to the chip according to the working state information or the application scenario information of the chip may further include:

if the external light intensity is lower than a fifth threshold value, sending the eleventh voltage frequency scaling information to the chip, in which the eleventh voltage frequency scaling information may be configured to instruct the chip to decrease its working voltage or working frequency.

An embodiment of the application, the chip is applied to image retouching, the voltage frequency scaling information may include twelfth voltage frequency scaling information and thirteenth voltage frequency scaling information, and sending the voltage frequency scaling information to the chip according to the working state information or the application scenario information of the chip may further include:

if the application scenario information is a face image, sending the twelfth voltage frequency scaling information to the chip, in which the twelfth voltage frequency scaling information may be configured to instruct the chip to decrease its working voltage, and if the application scenario information is not a face image, sending the thirteenth voltage frequency scaling information to the chip, in which the thirteenth voltage frequency scaling information may be configured to instruct the chip to decrease its working voltage or working frequency.

Along with increase of a working frequency and constant development of a semiconductor process, a problem about power consumption of a chip has become an important factor considered for a deep sub-nanometer integrated circuit. DVFS is a DVFS technology which is widely adopted for the field of semiconductors at present. Specifically, the DVFS technology dynamically scales a running frequency and voltage of a chip (for the same chip, if the frequency is higher, a higher voltage is required), thereby achieving a purpose of saving energy. However, in related arts, there are no DVFS methods and corresponding device designs applied to intelligent chips such as a convolutional operation device.

Another aspect of the application provides a convolutional operation device, which may include a DVFS device, an instruction storage unit, a control unit, a data access unit, an interconnection module, a primary computational module and N secondary computational modules, in which N may be an integer larger than 1.

The instruction storage unit may be configured to store an instruction read in by the data access unit.

The control unit may be configured to read the instruction from the instruction storage unit and decode the instruction into a control signal for controlling an operation of another modules, and the other modules may include the data access unit, the primary computational module, and the N secondary computational modules.

The data access unit may be configured to perform a data or instruction read/write operation between an external address space and the convolutional operation device.

The N secondary computational modules are configured to implement convolutional operation of input data and convolution kernels in a convolutional neural network algorithm;

The interconnection module may be configured for data transfer between the primary computational module and the secondary computational modules.

The primary computational module may be configured to splice intermediate vectors of all the input data into an intermediate result and perform subsequent computation on the intermediate result.

The DVFS device may be configured to acquire working state information of the convolutional operation device and send voltage frequency scaling information to the convolutional operation device according to the working state information of the convolutional operation device, in which the voltage frequency scaling information may be configured to instruct the convolutional operation device to scale its working voltage or working frequency.

An embodiment of the application, the primary computational module may be further configured to add the intermediate result and offset data, and perform an activation operation.

An embodiment of the application, the N secondary computational modules are configured to use the same input data and their respective convolutional kernels to concurrently compute respective output scalars.

An embodiment of the application, an active function active used by the primary computational module is any nonlinear function including sigmoid, tanh, relu, and softmax.

An embodiment of the application, the interconnection module forms a data path of continuous or discrete data between the primary computational module and the N secondary computational modules, and the interconnection module is any structure in a tree structure, a ring structure, a grid structure, a hierarchical interconnection structure, and a bus structure.

An embodiment of the application, the primary computational module may include:
 a first storage unit configured to cache the input data and output data used by the primary computational module in a computation process;
 a first computation unit configured to complete various computational functions of the primary computational module; and
 a first data dependency relationship judgment unit configured as a port through which the first computation unit reads and writes the first storage unit to ensure data read/write consistency of the first storage unit; and configured to read an input neuron vector from the first storage unit, to send the input neuron vector to the N secondary computational modules through the interconnection module, and to send an intermediate result vector from the interconnection module to the first computation unit.

An embodiment of the application, each secondary computational module of the N secondary computational modules may include:
 a second computation unit configured to receive the control signal sent by the control unit and perform arithmetic logical operation;
 a second data dependency relationship judgment unit configured to perform a read/write operation on a second storage unit and a third storage unit in a computation process to ensure read/write consistency of the second storage unit and the third storage unit;
 the second storage unit configured to cache the input data and the output scalar obtained by computation of the each secondary computational module; and
 the third storage unit configured to cache the convolutional kernel required by the each secondary computational module in the computation process.

An embodiment of the application, the first data dependency relationship judgment unit and the second data dependency relationship judgment unit ensure the read/write consistency in a manner of:
 judging whether a dependency relationship is formed between data of a control signal which has yet not been performed and a control signal which is under performing, if a dependency relationship is not formed between data of a control signal which has yet not been performed and a control signal which is under performing, allowing the control signal to be sent immediately, otherwise allowing the control signal to be sent only after all control signals the control signal depends on are performed.

An embodiment of the application, the data access unit reads in at least one of the input data, the offset data, and the convolutional kernels from the external address space.

An embodiment of the application, the DVFS device may include:
 an information acquisition unit configured to acquire the working state information of the convolutional operation device in real time; and
 a voltage frequency scaling unit configured to send the voltage frequency scaling information to the convolutional operation device according to the working state information of the convolutional operation device, in which the voltage frequency scaling information may be configured to instruct the convolutional operation device to scale its working voltage or working frequency.

An embodiment of the application, the working state information of the convolutional operation device may include an operating speed of the convolutional operation device, the voltage frequency scaling information may include first voltage frequency scaling information, and the voltage frequency scaling unit may be configured to:
 if the operating speed of the convolutional operation device is greater than a target speed, send the first voltage frequency scaling information to the convolutional operation device, in which the first voltage frequency scaling information may be configured to instruct the convolutional operation device to decrease its working frequency or working voltage, where the target speed is an operating speed of the convolutional operation device if a user requirement is met.

An embodiment of the application, the working state information of the convolutional operation device may include an operating speed of the data access unit and an operating speed of the primary computational module, the voltage frequency scaling information may include second voltage frequency scaling information, and the voltage frequency scaling unit may be further configured to:
 in response to determining, according to the operating speed of the data access unit and the operating speed of the primary computational module, that a running time of the data access unit exceeds a running time of the primary computational module, send the second voltage frequency scaling information to the primary computational module, in which the second voltage frequency scaling information may be configured to instruct the primary computational module to decrease its working frequency or working voltage.

An embodiment of the application, the voltage frequency scaling information may include third voltage frequency scaling information, and the voltage frequency scaling unit may be further configured to:
 in response to determining, according to the operating speed of the data access unit and the operating speed of the primary computational module, that the running time of the primary computational module exceeds the running time of the data access unit, send the third voltage frequency scaling information to the data access unit, in which the third voltage frequency scaling information may be configured to instruct the data access unit to decrease its working frequency or working voltage.

An embodiment of the application, the working state information of the convolutional operation device may include working state information of at least S units/modules in the instruction storage unit, the control unit, the data access unit, the interconnection module, the primary computational module, and the N secondary computational modules, in which S may be an integer larger than one and less than or equal to N+5, the voltage frequency scaling information may include fourth voltage frequency scaling information, and the voltage frequency scaling unit may be configured to:

in response to determining, according to the working state information of a unit A, that the unit A is in an idle state, send the fourth voltage frequency scaling information to the unit A, in which the fourth voltage frequency scaling information may be configured to instruct the unit A to decrease its working frequency or working voltage, where the unit A is any one of the at least S units/modules.

An embodiment of the application, the voltage frequency scaling information may include fifth voltage frequency scaling information, and the voltage frequency scaling unit may be further configured to:

in response to determining, according to the working state information of the unit A, that the unit A returns to a working state, send the fifth voltage frequency scaling information to the unit A, in which the fifth voltage frequency scaling information may be configured to instruct the unit A to increase its working voltage or working frequency.

Another aspect of the application provides a neural network processor, which may include the abovementioned convolutional operation device.

Another aspect of the application provides an electronic device, which may include the abovementioned neural network processor.

Another aspect of the application provides a method for performing a single-layer convolutional neural network forward computation, which is applied to the abovementioned convolutional operation device and may include the follows:

pre-storing an input/output (IO) instruction at a starting address of an instruction storage unit;

if the computation is started, a control unit reading the IO instruction from the starting address of the instruction storage unit, and a data access unit reading, according to a control signal decoded from the IO instruction, all corresponding convolutional neural network computational instructions from an external address space and caching all the instructions in the instruction storage unit;

the control unit reading in a next IO instruction from the instruction storage unit, and the data access unit reading all data required by a primary computational module from the external address space to a first storage unit of the primary computational module according to a control signal decoded from the next IO instruction;

the control unit reading in another IO instruction from the instruction storage unit, and the data access unit reading convolutional kernel data required by secondary computational modules from the external address space according to a control signal decoded from the another IO instruction;

the control unit reading in a next CONFIG instruction from the instruction storage unit, and the convolutional operation device configuring various constants required by computation of a present layer of a neural network according to a control signal decoded from the next CONFIG instruction;

the control unit reading in a next COMPUTE instruction from the instruction storage unit, and the primary computational module sending input data in a convolutional window to the N secondary computational modules through an interconnection module according to a control signal decoded from the next COMPUTE instruction, storing the input data in second storage units of the N secondary computational modules, and moving the convolutional window according to the instruction;

computation units of the N secondary computational modules reading convolutional kernels from third storage units according to the control signal decoded from the COMPUTE instruction, reading the input data from the second storage units, completing convolutional operation of the input data and the convolutional kernels, and returning obtained output scalars through the interconnection module;

splicing the output scalars returned by the N secondary computational modules into complete intermediate vectors step by step in the interconnection module;

the primary computational module obtaining the intermediate vectors returned by the interconnection module, moving the convolutional window to traverse all the input data, splicing all the returned intermediate vectors into an intermediate result, reading offset data from the first storage unit according to the control signal decoded from the COMPUTE instruction, and adding the offset data and the intermediate result together to obtain an offset result through a vector addition unit, an activation unit activating the offset result and writing final output data back into the first storage unit;

the control unit reading in yet another IO instruction from the instruction storage unit, and the data access unit storing the output data of the first storage unit to a specified address of the external address space according to a control signal decoded from the next IO instruction.

The computation is ended.

An embodiment of the application, the method may further include the follows:

acquiring working state information of the convolutional operation device in real time;

sending voltage frequency scaling information to the convolutional operation device according to the working state information of the convolutional operation device, in which the voltage frequency scaling information may be configured to instruct the convolutional operation device to scale its working voltage or working frequency.

An embodiment of the application, the working state information of the convolutional operation device may include an operating speed of the convolutional operation device, the voltage frequency scaling information may include first voltage frequency scaling information, and sending the voltage frequency scaling information to the convolutional operation device according to the working state information of the convolutional operation device may include:

if the operating speed of the convolutional operation device is greater than a target speed, sending the first voltage frequency scaling information to the convolutional operation device, in which the first voltage frequency scaling information may be configured to instruct the convolutional operation device to decrease its working frequency or working voltage, and the target speed may be an operating speed of the convolutional operation device if a user requirement is met.

An embodiment of the application, the working state information of the convolutional operation device may include an operating speed of the data access unit and an operating speed of the primary computational module, the voltage frequency scaling information may include second voltage frequency scaling information, and sending the voltage frequency scaling information to the convolutional operation device according to the working state information of the convolutional operation device further may include:

in response to determining, according to the operating speed of the data access unit and the operating speed of the primary computational unit, that the running time of the primary computational unit exceeds the running time of the data access unit, sending the second voltage frequency scaling information to the primary computational module, in which the second voltage frequency scaling information may be configured to instruct the primary computational module to decrease its working frequency or working voltage.

An embodiment of the application, the voltage frequency scaling information may include third voltage frequency scaling information, and sending the voltage frequency scaling information to the convolutional operation device according to the working state information of the convolutional operation device may further include:

in response to determining, according to the operating speed of the data access unit and the operating speed of the primary computational unit, that the running time of the primary computational unit exceeds the running time of the data access unit, sending the third voltage frequency scaling information to the data access unit, in which the third voltage frequency scaling information may be configured to instruct the data access unit to decrease its working frequency or working voltage.

An embodiment of the application, the working state information of the convolutional operation device may include working state information of at least S units/modules in the instruction storage unit, the control unit, the data access unit, the interconnection module, the primary computational module, and the N secondary computational modules, in which S may be an integer larger than one and less than or equal to N+5, the voltage frequency scaling information may include fourth voltage frequency scaling information, and sending the voltage frequency scaling information to the convolutional operation device according to the working state information of the convolutional operation device may further include:

in response to determining, according to the working state information of a unit A, that the unit A is in an idle state, sending the fourth voltage frequency scaling information to the unit A, in which the fourth voltage frequency scaling information may be configured to instruct the unit A to decrease its working frequency or working voltage, where the unit A is any one of the at least S units/modules.

An embodiment of the application, the voltage frequency scaling information may include fifth voltage frequency scaling information, and sending the voltage frequency scaling information to the convolutional operation device according to the working state information of the convolutional operation device may further include:

in response to determining, according to the working state information of the unit A, that the unit A returns to a working state, sending the fifth voltage frequency scaling information to the unit A, in which the fifth voltage frequency scaling information may be configured to instruct the unit A to increase its working voltage or working frequency.

Another aspect of the application provides a method for performing multilayer convolutional neural network forward computation, which may include:

performing the abovementioned method for single-layer convolutional neural network forward computation on each layer of the multilayer convolutional neural network, after performing for a previous layer of the multilayer convolutional neural network, a computational instruction of a present layer taking an output data address, stored in a primary computational module, of the previous layer as an input data address of the present layer, and changing convolutional kernel address and offset data address in the computational instruction into corresponding addresses of the present layer.

Along with arrival of the big data era, data keeps growing explosively. Massive data containing information is transferred between users. Image, as a vision foundation for perception of the world by the human beings, is an important means for the human beings to acquire information, express information, and transfer information.

In related arts, image compression can effectively reduce a data volume and increase an image transfer rate. However, after an image is compressed, it is unlikely to reserve all information of the original image. Therefore, how to perform image compression is still a technical problem to be solved by those skilled in the art.

Another aspect of the application provides an image compression method, which may include:

acquiring an original image with a first resolution, in which the original image may be any training image in a compression training image set of a compression neural network and tag information of the original image may be determined as target tag information;

compressing the original image on the basis of a target model to obtain a compressed image with a second resolution, in which the second resolution may be lower than the first resolution and the target model may be a present compression neural network model of the compression neural network;

recognizing the compressed image on the basis of a recognition neural network model to obtain reference tag information, in which the recognition neural network model may be a corresponding recognition neural network model if training of a recognition neural network is completed;

acquiring a loss function according to the target tag information and the reference tag information;

if the loss function is convergent to a first threshold value or the present number of training times of the compression neural network is more than or equal to a second threshold value, acquiring a target original image with the first resolution, and determining the target model as a corresponding compression neural network model if training of the compression neural network is completed; and compressing the target original image on the basis of the compression neural network model to obtain a target compressed image with the second resolution.

An embodiment of the application, the image compression method may further include:

if the loss function is not convergent to the first threshold value or the present number of training times of the compression neural network is smaller than the second threshold value, upgrading the target model according to the loss function to obtain an updated model, where the updated model may be determined as the target model, a next training image may be determined as the original image, and acquiring the original image with the first resolution is performed.

An embodiment of the application, recognizing the compressed image on the basis of the recognition neural network model to obtain the reference tag information may include:
preprocessing the compressed image to obtain an image to be recognized; and
recognizing the image to be recognized on the basis of the recognition neural network model to obtain the reference tag information.

An embodiment of the application, preprocessing may include size processing, and preprocessing the compressed image to obtain the image to be recognized may include:
if an image size of the compressed image is smaller than a basic image size of the recognition neural network, filling the compressed image with pixels according to the basic image size to obtain the image to be recognized.

An embodiment of the application, the compression training image set may include at least a recognition training image set, and the image compression method may further include:
adopting the recognition training image set to train the recognition neural network to obtain the recognition neural network model, and each training image in the recognition training image set at least including tag information consistent with a type of the target tag information.

An embodiment of the application, after compressing the target original image on the basis of the compression neural network model to obtain the target compressed image with the second resolution, the method may further include:
compressing the target compressed image on the basis of the recognition neural network model to obtain tag information of the target original image, and storing the tag information of the target original image.

An embodiment of the application, the compression training image set may include multiple dimensions, and compressing the original image on the basis of the target model to obtain the compressed image with the second resolution may include:
recognizing the original image on the basis of the target model to obtain multiple pieces of image information, in which each dimension may correspond to a piece of the image information; and
compressing the original image on the basis of the target model and the multiple pieces of the image information to obtain the compressed image.

Another aspect of the application provides an image compression device, which may include a processor and a memory connected with the processor.

The memory may be configured to store a first threshold value, a second threshold value, a present neural network model and training times of a compression neural network, a compression training image set of the compression neural network, tag information of each training image in the compression training image set, a recognition neural network model, and a compression neural network model. The present neural network model of the compression neural network is determined as a target model, the compression neural network model is a corresponding target model if training of the compression neural network is completed, and the recognition neural network model is a corresponding neural network model if training of a recognition neural network is completed.

The processor may be configured to acquire an original image with a first resolution, in which the original image may be any training image in the compression training image set and tag information of the original image may be determined as target tag information. The processor may be further configured to compress the original image on the basis of the target model to obtain a compressed image with a second resolution, in which the second resolution may be lower than the first resolution. The processor may be further configured to recognize the compressed image on the basis of the recognition neural network model to obtain reference tag information. The processor may be further configured to acquire a loss function according to the target tag information and the reference tag information. If the loss function is convergent to the first threshold value or the count of training times is more than or equal to the second threshold value, the processor may be configured to acquire a target original image with the first resolution, to determine the target model as the compression neural network model, and to compress the target original image on the basis of the compression neural network model, so as to obtain a target compressed image with the second resolution.

An embodiment of the application, the processor may be further configured to, if the loss function is not convergent to the first threshold value or the count of training times is smaller than the second threshold value, update the target model according to the loss function to obtain an updated model, to determine the updated model as the target model, to determine a next training image as the original image, and to perform the operation of acquiring the original image with the first resolution.

An embodiment of the application, the processor may be configured to preprocess the compressed image to obtain an image to be recognized, and to recognize the image to be recognized on the basis of the recognition neural network model to obtain the reference tag information.

An embodiment of the application, preprocessing may include size processing. The memory may be further configured to store a basic image size of the recognition neural network. The processor may be further configured to, if an image size of the compressed image is smaller than the basic image size, fill the compressed image with pixels according to the basic image size to obtain the image to be recognized.

An embodiment of the application, the compression training image set may include at least a recognition training image set, and the processor may be further configured to adopt the recognition training image set to train the recognition neural network to obtain the recognition neural network model, in which each training image in the recognition training image set may include at least tag information consistent with a type of the target tag information.

An embodiment of the application, the processor may be further configured to recognize the target compressed image on the basis of the recognition neural network model to obtain tag information of the target original image; and the memory may be further configured to store the tag information of the target original image.

An embodiment of the application, the compression training image set may include multiple dimensions, and the processor may be further configured to recognize the original image on the basis of the target model to obtain multiple pieces of image information, in which each dimension may correspond to a piece of the image information, and to compress the original image on the basis of the target model and the multiple pieces of the image information, so as to obtain the compressed image.

Another aspect of the application provides another electronic device, which may include a processor, a memory, a communication interface, and one or more programs, where the one or more programs are stored in the memory and are configured to be performed by the processor, and the programs include instructions configured for part or all of the operations described in the abovementioned image compression method.

Another aspect of the application provides a computer-readable storage medium, which stores a computer program, where the computer program may include a program instruction, and the program instruction is performed by a processor to enable the processor to perform the abovementioned image compression method.

Compared with the related arts, the processing method and device as well as the operation method and device provided by the application at least have the following advantages.

1. A quantization method is adopted to quantize the neurons and the weights of the neural network, the weight dictionary and the weight codebook are adopted to represent the quantized weights, the neuron dictionary and the neuron codebook are adopted to represent the quantized neurons, and then the computation in the neural network is converted into the table lookup operation. Therefore, the count of stored parameters of the neural network is reduced, and memory access energy consumption and computation energy consumption are reduced. A lookup-table-based operation method is integrated in the neural network processor, so that the table lookup operation is optimized, the structure is simplified, the memory access energy consumption and computation energy consumption of the neural network are reduced, and meanwhile, computational diversity may also be achieved.
2. The neural network may be retrained, and during retraining, only the codebooks are required to be trained and the weight dictionary is not required to be trained, so that a retraining operation is simplified.
3. The neural network-dedicated instruction for locally quantized multilayer artificial neural network computation and the flexible computation units are adopted, so that the problems of poor computational performance of a Central Processing Unit (CPU) and a Graphics Processing Unit (GPU) and high front-end decoding overhead are solved, and support to a multilayer artificial neural network computation algorithm is effectively improved.
4. A dedicated on-chip cache for the multilayer artificial neural network computation algorithm is adopted, so that reusability of the input neurons and the weight data is fully mined, repeated reading of these data from the memory is avoided, a memory access bandwidth is reduced, and performance bottleneck problems brought by a memory bandwidth to multilayer artificial neural network computation and a training algorithm of the multilayer artificial neural network computation are solved.

DETAILED DESCRIPTION OF THE EMBODIMENTS

In order to make the purpose, technical solutions and advantages of the disclosure clearer, the disclosure will further be described below in combination with specific embodiments and with reference to the drawings in detail.

For the technical defect in related arts that a huge amount of computation for data processing of a neural network may hinder application of the neural network, the application provides a processing method and device and an operation method and device. By the processing method and device, two types of data, for example, input neurons and weights, are quantized to mine similarities between interlayer data and inter-segment data and local similarities between intra-layer data and intra-segment data respectively, so as to mine distribution characteristics of the two types of data, and low-bit quantization is performed to reduce the count of bits configured to represent each piece of data. Therefore, a data storage overhead and a memory access overhead are reduced. According to the processing method and device, a table lookup operation is performed to implement a computational operation over the quantized neurons and weights, so that memory access energy consumption and computation energy consumption of a neural network are reduced.

Input neurons and output neurons mentioned in the application do not refer to neurons in an input layer and neurons in an output layer in the whole neural network. For any two adjacent layers in the network, neurons in a lower layer for feedforward computation of the network are input neurons and neurons in an upper layer for the feedforward computation of the network are output neurons. For example, for a convolutional neural network, assume that the convolutional neural network has L layers, and K=1, 2, . . . , L−1. For the $K^{th}$ layer and the $(K+1)^{th}$ layer, the $K^{th}$ layer may be an input layer in which neurons are input neurons, and the $(K+1)^{th}$ layer may be an output layer in which neurons are output neurons. In other words, except a top layer, each layer may be determined as an input layer, and a layer below it may be a corresponding output layer.

In order to make the purpose, technical solutions, and advantages of the application clearer, the application will further be described below in combination with specific embodiments and with reference to the drawings in detail.

Figure 1:
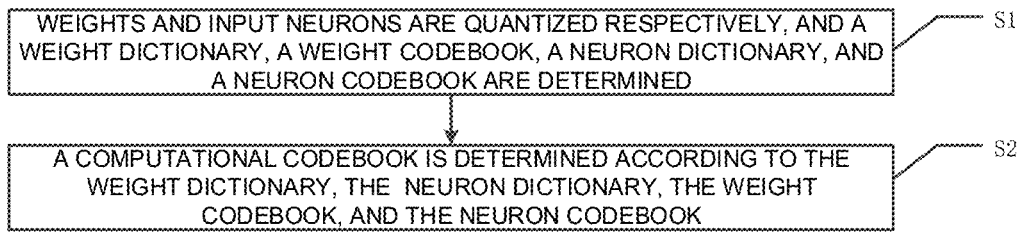
FIG. 1 is a schematic flowchart of a processing method according to an embodiment of the application.

FIG. 1 is a schematic flowchart of a processing method according to an embodiment of the application. As shown in FIG. 1, the processing method may include the following.

In S1, weights and input neurons are quantized respectively, and a weight dictionary, a weight codebook, a neuron dictionary, and a neuron codebook are determined.

A process of quantifying the weights may include the following:
- grouping the weights, adopting a clustering algorithm to perform a clustering operation on the weights of each group to divide the weights of each group into m types, in which m may be a positive integer and the weights of each type corresponding to a weight index, and determining the weight dictionary, where the weight dictionary may include weight positions and weight indices, and the weight positions refer to positions of the weights in a neural network structure;
- replacing all the weights of each type with a central weight, and determining the weight codebook, where the weight codebook may include the weight indices and the central weights.

Figure 2:
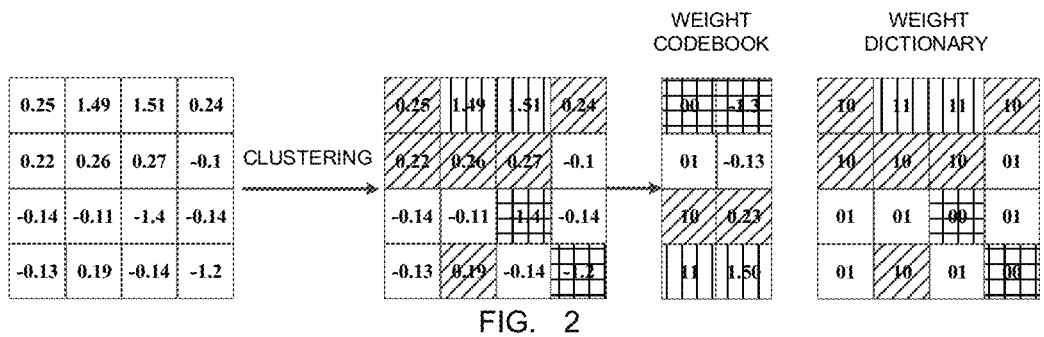
FIG. 2 is a schematic diagram of a process of quantizing weights according to an embodiment of the application.

FIG. 2 is a schematic diagram of a process of quantifying weights according to an embodiment of the application. As shown in FIG. 2, the weights are grouped according to a preset grouping strategy to obtain a weight matrix which is arranged in order. Then, intra-group sampling and the clustering operation are performed on the weight matrix obtained by grouping. The weights with approximate numerical values are divided into the same types. Central weights 1.50, −0.13, −1.3, and 0.23 under four types are computed according to a loss function, and correspond to the weights of the four types respectively. In a known weight codebook, a weight index of the type with the central weight −1.3 is 00, a weight index of the type with the central weight −0.13 is 01, a weight index of the type with the central weight 0.23 is 10, and a weight index of the type with the central weight 1.50 is 11. In addition, the four weight indices (00, 01, 10, and 11) corresponding to the four central weights are adopted to represent the weights in the corresponding types respectively, such that a weight dictionary is obtained. It is to be noted that the weight dictionary further may include weight positions, for example, the positions of the weights in the neural network structure. In the weight dictionary, a weight position refers to a coordinate, for example, (p, q), of the $p^{th}$ row and the $q^{th}$ column. In the embodiment, $1 \leq p \leq 4$ and $1 \leq q \leq 4$.

Thus it can be seen that, by the quantization process, similarities between interlayer weights and local similarities between intra-layer weights in the neural network are fully mined to obtain a distribution characteristic of the weights of the neural network, and low-bit quantization may be performed to reduce the count of bits configured to represent each weight. Therefore, a weight storage overhead and a memory access overhead are reduced.

In some implementations, the preset grouping strategy may include, but is not limited to, the following strategies: division into a group: all the weights in a neural network are divided into a group; layer-type-based grouping: weights of all convolutional layers, weights of all fully connected layers, and weights of all LSTM network layers in the neural network are divided into a group respectively; interlayer grouping: weights of one or more convolutional layers, weights of one or more fully connected layers, and weights of one or more LSTM network layers in the neural network are divided into a group respectively; and intra-layer grouping: weights in a layer of the neural network are segmented, and each segmented part is divided into a group.

The clustering algorithm may include K-means, K-medoids, Clara, and/or Clarans. A selection method for the central weight corresponding to each type may include that: a value of $W_0$ corresponding to a minimum cost function $J(w,w_0)$ is determined as the central weight. The cost function may be a squared distance function:

$$J(w, w_0) = \sum_{i=1}^{n} (w_i - w_0)^2,$$

where J is the cost function, W refers to all the weights of the type, $W_0$ is the central weight, n is the count of all the weights of the type, W is the $i^{th}$ weight of the type, and n is a positive integer.

Furthermore, describing quantization of the input neurons may include the following:
- dividing the input neurons divided into p segments, in which the input neurons of each segment may correspond to a neuron range and a neuron index, and determining the neuron dictionary, in which p may be a positive integer;
- coding the input neurons, replacing all the input neurons of each segment with a central neuron, and determining the neuron codebook.

Figure 3:
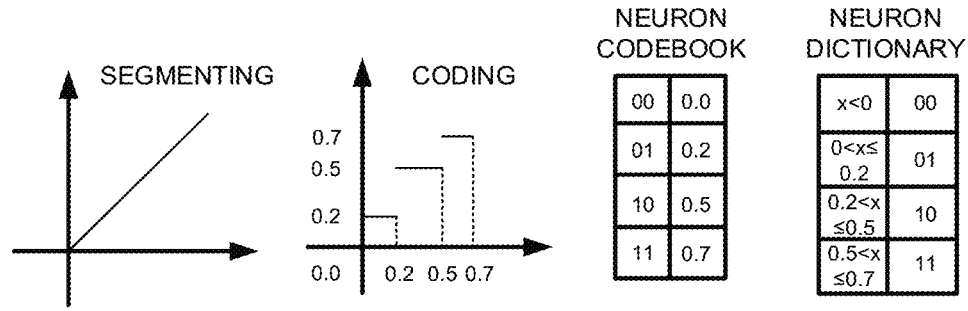
FIG. 3 is a schematic diagram of a process of quantizing input neurons according to an embodiment of the application.

FIG. 3 is a schematic diagram of a process of quantifying input neurons according to an embodiment of the application. As shown in FIG. 3, specific descriptions will be made in the embodiment with quantization of neurons of a ReLU activation layer as an example. A ReLU function is segmented into totally four segments. Central neurons of the four segments are represented by 0.0, 0.2, 0.5, and 0.7 respectively, and neuron indices are represented by 00, 01, 10, and 11. A neuron codebook and a neuron dictionary are finally generated, where the neuron codebook may include the neuron indices and the central neurons, and the neuron dictionary may include neuron ranges and the neuron indices. The neuron ranges and the neuron indices are correspondingly stored and x (shown in FIG. 3) represents a value of a neuron if the neuron is not quantized. By the quantization process of the input neurons, the input neurons may be divided into multiple segments according to a practical requirement, an index of each segment is obtained, and then the neuron dictionary is formed. Then, the input neurons in each segment are replaced with the central neurons in the neuron codebook according to the neuron indices. Similarities between the input neurons may be fully mined to obtain a distribution characteristic of the input neurons, and low-bit quantization is performed to reduce the count of bits representing each input neuron, so that an input neuron storage overhead and a memory access overhead are reduced.

In S2, determining a computational codebook according to the weight codebook and the neuron codebook may include the following:
- in S21, determining the corresponding weight indices in the weight codebook according to the weights, and determining the central weights corresponding to the weights through the weight indices;
- in S22, determining the corresponding neuron indices in the neuron codebook according to the input neurons, and determining the central neurons corresponding to the input neurons through the neuron indices; and
- in S23, performing a computational operation on the central weights and the central neurons to obtain computational results, and forming the computational results to a matrix so as to determine the computational codebook.

Figure 4:
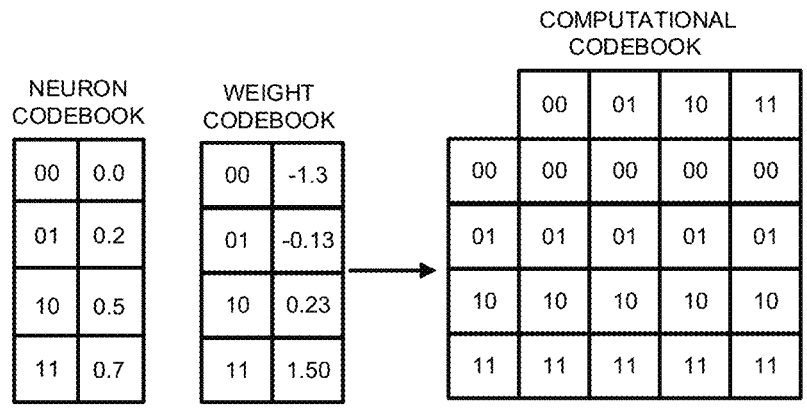
FIG. 4 is a schematic diagram of a process of determining an operational codebook according to an embodiment of the application.

FIG. 4 is a schematic diagram of a process of determining a computational codebook according to an embodiment of the application. As shown in FIG. 4, a multiplication codebook is taken as an example in the embodiment. In other embodiments, the computational codebook may also be an addition codebook, a pooling codebook, and the like, which is not limited herein. According to a weight dictionary, weight indices corresponding to weights are determined, and central weights corresponding to the weight indices are determined. According to a neuron codebook, neuron indices corresponding to input neurons are determined, and central neurons corresponding to the neuron indices are determined. The neuron indices and the weight indices are taken as row indices and column indices of the computational codebook, multiplication computation is performed on the central neurons and the central weights, and a matrix is formed to obtain the multiplication codebook.

After S2, the method may further include the following. In S3, the weights and the input neurons are retrained. During retraining, only the weight codebook and the neuron codebook are trained, and contents in the weight dictionary and the neuron dictionary are kept unchanged, so that a retraining operation is simplified and a workload is reduced. Preferably, a back propagation algorithm is adopted for retraining.

Figure 5:
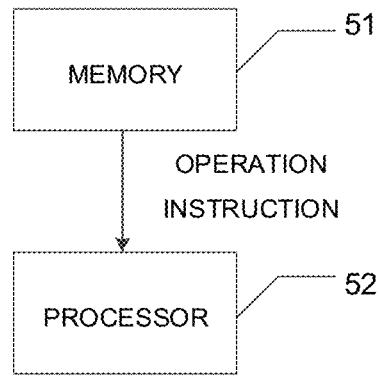
FIG. 5 is a schematic structure diagram of a processing device according to an embodiment of the application.

FIG. 5 is a schematic structure diagram of a processing device according to an embodiment of the application. As shown in FIG. 5, the processing device may include a memory 51 and a processor 52.

The memory 51 may be configured to store an computation instruction.

The processor 52 may be configured to perform the computation instruction stored in the memory, in which the computation instruction may be performed for operations according to the abovementioned processing method. The computation instruction may be a binary number including an operation code and an address code. The operation code indicates an operation to be performed by the processor 52. The address code instructs the processor 52 to read data participating in the operation from an address in the memory 51.

According to the data processing device of the application, the processor 52 can perform the operations of the abovementioned data processing method by performing the computation instruction in the memory 51. Disordered weights and input neurons may be quantized to obtain low-bit and normalized central weights and central neurons. Local similarities between the weights and the input neurons can be mined to obtain distribution characteristics of the weights and the input neurons, and low-bit quantization can be performed according to the distribution characteristics to reduce the count of bit representing each weight and input neuron. Therefore, a storage overhead and a memory access overhead of the weights and the input neurons are reduced.

Figure 6:
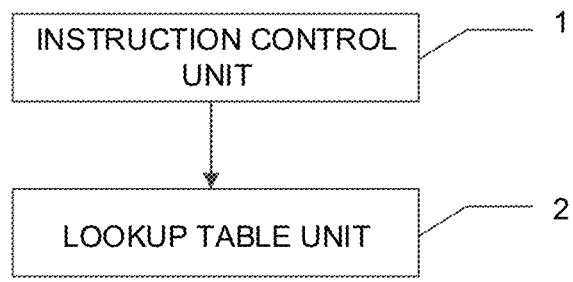
FIG. 6 is a schematic structure diagram of an operation device according to an embodiment of the application.

FIG. 6 is a schematic structure diagram of an operation device according to an embodiment of the application. As shown in FIG. 6, the operation device may include an instruction control unit 1 and a lookup table unit 2.

The instruction control unit 1 may be configured to decode a received instruction and generate lookup control information.

The lookup table unit 2 may be configured to look output neurons up in a computational codebook according to the lookup control information generated by the instruction control unit 1 and a received weight dictionary, neuron dictionary, computational codebook, weights, and input neurons. The weight dictionary may include weight positions (for example, positions of the weights in a neural network structure, for example, represented by (p, q), which representing a position in the $p^{th}$ row and the $q^{th}$ column in the weight dictionary) and weight indices. The neuron dictionary may include the input neurons and neuron indices. The computational codebook may include the weight indices, the neuron indices, and computational results of the input neurons and the weights.

A specific working process of the lookup table unit is as follows: determining the corresponding weight position of the weight in the weight dictionary according to the weights, determining the weight indices, determining the neuron indices according to corresponding neuron ranges of the input neurons in the neuron dictionary, determining the weight indices and the neuron indices as column indices and row indices of the computational codebook, looking up numerical values corresponding to the columns and rows (the computational results) in the computational codebook, where the numerical values are the output neurons.

As illustrated in FIG. 2 to FIG. 4, during a lookup operation, if a neuron index of a certain neuron is 01 and a weight index of a certain weight is 10, if computation is performed on the neuron and the weight, a corresponding numerical value 0.046 in the second row and the third column in the multiplication codebook is looked up. The corresponding numerical value is an output neuron. Similarly, addition and pooling operations are similar to a multiplication operation and will not be elaborated herein. It can be understood that pooling may include, but is not limited to, average pooling, maximum pooling, and median pooling.

In one implementation, according to different computational operations, a lookup table may include at least one of a multiplication lookup table, an addition lookup table, and a pooling lookup table.

The multiplication lookup table may be configured to perform a table lookup operation mult_lookup, according to an input weight index in1 input and an neuron index in2, through the multiplication lookup table to complete a multiplication operation over a central weight data1 corresponding to the weight index and a central neuron data2 corresponding to the neuron index, for example, performing a table lookup operation out=mult_lookup(in1,in2) to realize a multiplication function out=data1*data2.

The addition lookup table may be configured to perform a table lookup operation add_lookup through a step-by-step addition lookup table according to an input index in to complete an addition operation over central data data corresponding to the index, where in and data are vectors with lengths of N and N is a positive integer, for example, performing a table lookup operation out=add_lookup(in) to realize an addition function out=data[1]+data[2]+ . . . +data [N] and/or to perform a table lookup operation on the input weight index in1 and the neuron index in2 through the addition lookup table to complete an addition operation over a central weight data1 corresponding to the weight index and a central neuron data2 corresponding to the neuron index, for example, performing a table lookup operation out=add_lookup(in1,in2) to realize an addition function out=data1+data2.

The pooling lookup table may be configured to perform a pooling operation on the central data data corresponding to the input index, for example, performing a table lookup operation out=pool_lookup(in) to complete a pooling operation out=pool(data), the pooling operation including average pooling, maximum pooling, and median pooling.

Figure 7:
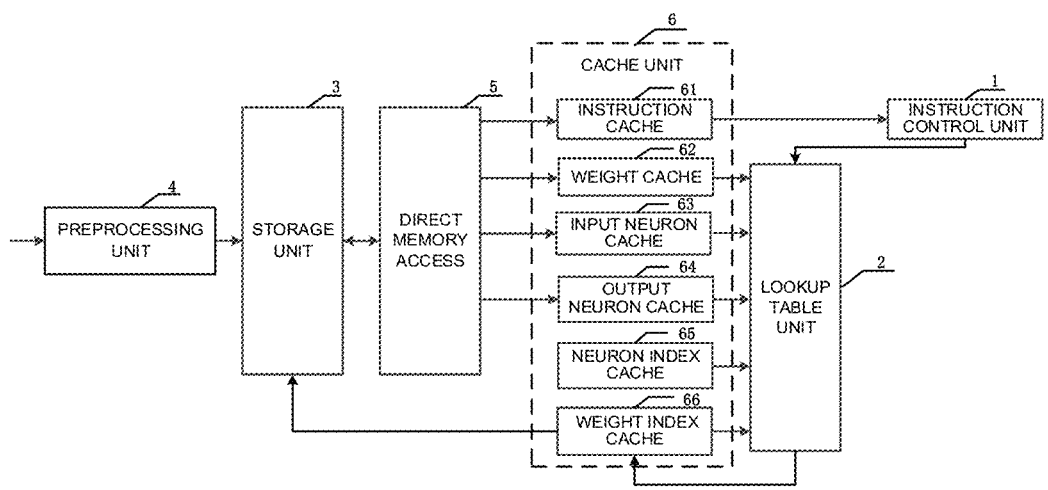
FIG. 7 is a schematic structure diagram of an operation device according to another embodiment of the application.

FIG. 7 is a schematic structure diagram of another operation device according to an embodiment of the application. As shown in FIG. 7, compared with the operation device in FIG. 6, the operation device of the embodiment further may include a preprocessing unit 4, a storage unit 3, a cache unit 6, and a DMA 5. A processing process of the application may be optimized, and data may be processed in a more ordered manner.

The preprocessing unit 4 may be configured to preprocess input information which is externally input to obtain the weights, the input neurons, the instruction, the weight dictionary, the neuron dictionary, and the computational codebook. Preprocessing may include, but is not limited to, segmentation, Gaussian filtering, binarization, regularization, and/or normalization.

The storage unit 3 may be configured to store the input neurons, the weights, the weight dictionary, the neuron dictionary, the computational codebook, and the instruction and to receive the output neurons.

The cache unit 6 may be configured to cache the instruction, the weight indices, the neuron indices, and the output neurons. The cache unit 6 may include an instruction cache 61, a weight cache 62, an input neuron cache 63, an output neuron cache 64, a neuron index cache 65, and a weight index cache 66.

The instruction cache 61 may be configured to cache the instruction and to output the cached instruction to the instruction control unit 1.

The weight cache 62 may be configured to cache the weights and to output the cached weights to the lookup table unit 2.

The input neuron cache 63 may be configured to cache the input neurons and to output the cached input neurons to the lookup table unit 2.

The output neuron cache 64 may be configured to cache the output neurons output by the lookup table unit 2 and to output the cached output neurons to the lookup table unit 2.

The neuron index cache 65 may be configured to determine the corresponding neuron indices according to the input neurons, to cache the neuron indices, and to output the cached neuron indices to the lookup table unit 2.

The weight index cache 66 may be configured to determine the corresponding weight indices according to the weights, to cache the weight indices, and to output the cached weight indices to the lookup table unit 2.

The DMA 5 may be configured to read and write data or instructions between the storage unit 3 and the cache unit 6.

In one implementation, regarding the instruction, the instruction may be a neural network-dedicated instruction, including all instructions dedicated to completion of artificial neural network computations. The neural network-dedicated instruction may include, but is not limited to, a control instruction, a data transfer instruction, a computational instruction, and a logical instruction. The control instruction controls a neural network performing process. The data transfer instruction completes data transfer between different storage media, and a data format may include, but is not limited to, a matrix, a vector, and a scalar. The computational instruction completes arithmetic operation of the neural network, and may include, but is not limited to, a matrix computation instruction, a vector computation instruction, a scalar computation instruction, a convolutional neural network computation instruction, a fully connected neural network computation instruction, a pooling neural network computation instruction, an RBM neural network computation instruction, an LRN neural network computation instruction, an LCN neural network computation instruction, an LSTM neural network computation instruction, a recurrent neural network (RNN) computation instruction, an ReLU neural network computation instruction, a PReLU neural network computation instruction, a sigmoid neural network computation instruction, and a neural network computation instruction, and a maxout neural network computation instruction. The logical instruction may be configured to complete logical operation of the neural network, and may include, but is not limited to, a vector logical operation instruction and a scalar logical operation instruction.

The RBM neural network computation instruction may be configured to implement RBM neural network computation.

The LRN neural network computation instruction may be configured to implement LRN neural network computation.

The LSTM neural network computation instruction may be configured to implement LSTM neural network computation.

The RNN computation instruction may be configured to implement RNN computation.

The ReLU neural network computation instruction may be configured to implement ReLU neural network computation.

The PReLU neural network computation instruction may be configured to implement PReLU neural network computation.

The sigmoid neural network computation instruction may be configured to implement sigmoid growth curve (sigmoid) neural network computation.

The tanh neural network computation instruction may be configured to implement hyperbolic tangent function (tanh) neural network computation.

The maxout neural network computation instruction may be configured to implement maxout neural network computation.

Furthermore, the neural network-dedicated instruction may include a Cambricon instruction set. The Cambricon instruction set may include at least one Cambricon instruction, with a length of the Cambricon instruction being 64 bit, including an operation code and an operand. The Cambricon instruction set may include four types of instructions, for example, Cambricon control instructions, Cambricon data transfer instructions, Cambricon computational instructions, and Cambricon logical instructions respectively.

In one implementation, the Cambricon control instruction may be configured to control a performing process including a jump instruction and a conditional branch instruction.

In one implementation, the Cambricon data transfer instruction may be configured to complete data transfer between different storage media including a load instruction, a store instruction, and a move instruction. The load instruction may be configured to load data from a main memory to a cache. The store instruction may be configured to store the data from the cache to the main memory. The move instruction may be configured to move the data between the cache and another cache, the cache and a register, or the register and another register. The data transfer instruction supports three different data organization manners, including the matrix, the vector, and the scalar.

In one implementation, the Cambricon computational instruction may be configured to complete the arithmetic operation of the neural network. The Cambricon computational instruction may include a Cambricon matrix computation instruction, a Cambricon vector computation instruction, and a Cambricon scalar computation instruction.

In one implementation, the Cambricon matrix computation instruction may be configured to complete matrix computation in the neural network, including matrix multiply vector, vector multiply matrix, matrix multiply scalar, outer product, matrix add matrix, and matrix subtract matrix.

In one implementation, the Cambricon vector computation instruction may be configured to complete vector computation in the neural network, including vector basic operations, vector transcendental functions, dot product, random vector generator, and maximum/minimum of a vector. The vector basic operations include vector addition, subtraction, multiplication, and division. The vector transcendental functions refer to those functions which do not meet any polynomial equations taking polynomials as coefficients, and include, but are not limited to, an exponential function, a logarithmic function, a trigonometric function, and an antitrigonometric function.

In one implementation, the Cambricon scalar computation instruction may be configured to complete scalar computation in the neural network, including scalar basic operations and scalar transcendental functions. The scalar basic operations include scalar addition, subtraction, multiplication, and division. The scalar transcendental functions refer to those functions which do not meet any polynomial equations taking polynomials as coefficients, and include, but are not limited to, an exponential function, a logarithmic function, a trigonometric function, and an anti-trigonometric function.

In one implementation, the Cambricon logical instruction may be configured to complete the logical operation of the neural network. The Cambricon logical instruction may include the Cambricon vector logical operation instruction and the Cambricon scalar logical operation instruction. The Cambricon vector logical operation instruction may be configured to complete vector compare computation, vector logical operations, and vector greater than merge computation. The vector compare computation may include, but is not limited to, greater than, smaller than, equal to, more than or equal to, less than or equal to, and unequal to. The vector logical operations include AND, OR, and NOT.

In one implementation, the Cambricon scalar logical operation instruction may be configured to complete scalar compare computation and scalar logical operations. The scalar compare computation may include, but is not limited to, greater than, smaller than, equal to, more than or equal to, less than or equal to, and unequal to. The scalar logical operations include AND, OR, and NOT.

Figure 8:
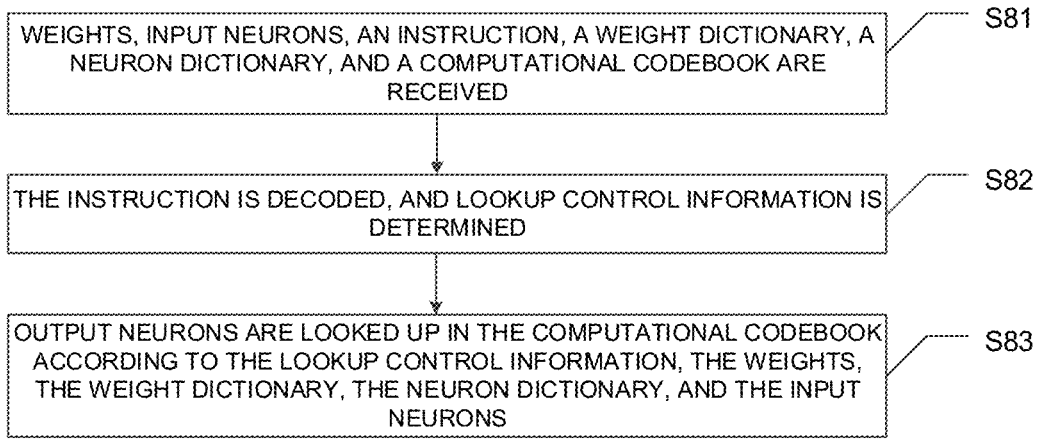
FIG. 8 is a schematic flowchart of another operation method according to an embodiment of the application.

FIG. 8 is a schematic flowchart of another operation method according to an embodiment of the application. As shown in FIG. 8, the operation method may include the following:

in S81, receiving weights, input neurons, an instruction, a weight dictionary, a neuron dictionary, and a computational codebook, where the weight dictionary may include weight positions and weight indices, the neuron dictionary may include the input neurons and neuron indices, the computational codebook may include the weight indices, the neuron indices, and computational results of the input neurons and the weights;

in S82, decoding the instruction, and determining lookup control information;

in S83, looking up output neurons in the computational codebook according to the lookup control information, the weights, the weight dictionary, the neuron dictionary, and the input neurons.

S83 is similar to the specific working process of the lookup table unit and may include the following:

in S831, according to the weights, the input neurons, the weight dictionary, and the neuron dictionary, determining neuron ranges to determine the neuron indices in the neuron dictionary, and determining the weight positions to determine the weight indices in the weight dictionary;

in S832, looking up the computational results in the computational codebook according to the weight indices and the neuron indices to determine the output neurons.

Figure 9:
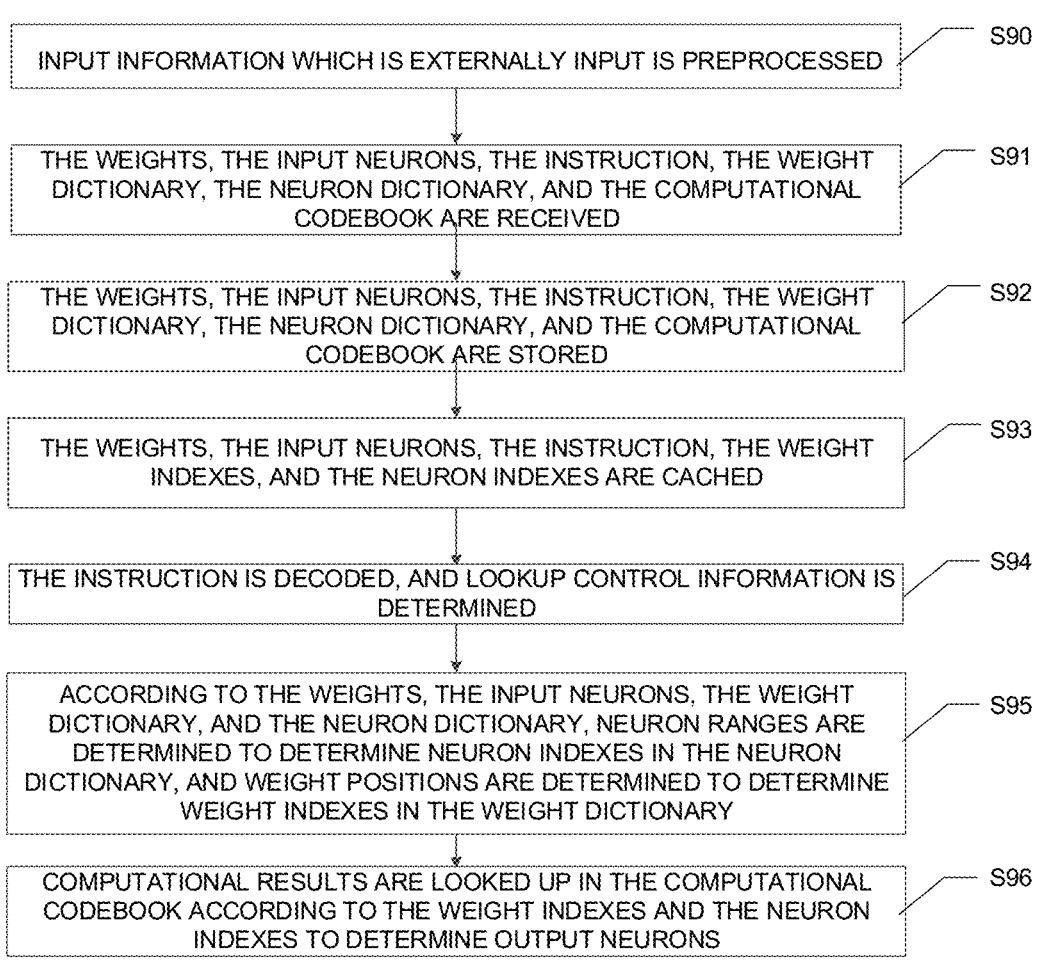
FIG. 9 is a schematic flowchart of another operation method according to an embodiment of the application.

For optimizing the operation method of the application and ensuring more convenient and ordered processing, an embodiment of the application provides another operation method. FIG. 9 is a schematic flowchart of another operation method according to an embodiment of the application. The operation method may include the following.

In S90, input information which is externally input is preprocessed.

In one implementation, preprocessing the input information which is externally input may include: obtaining weights, input neurons, instruction, weight dictionary, neuron dictionary, and computational codebook corresponding to the input information are obtained. Preprocessing may include segmentation, Gaussian filtering, binarization, regularization, and/or normalization.

In S91, the weights, the input neurons, the instruction, the weight dictionary, the neuron dictionary, and the computational codebook are received.

In S92, the weights, the input neurons, the instruction, the weight dictionary, the neuron dictionary, and the computational codebook are stored.

In S93, the weights, the input neurons, the instruction, the weight indices, and the neuron indices are cached.

In S94, the instruction is decoded, and lookup control information is determined.

In S95, according to the weights, the input neurons, the weight dictionary, and the neuron dictionary, neuron ranges are determined to determine neuron indices in the neuron dictionary, and weight positions are determined to determine weight indices in the weight dictionary.

In S96, computational results are looked up in the computational codebook according to the weight indices and the neuron indices to determine output neurons.

It is to be noted that each unit or module may be a circuit, including a digital circuit, an analogue circuit, and the like. Physical implementation of a structure of each unit or module may include, but is not limited to, a physical device, which may include, but is not limited to, a transistor, a memristor, and the like. The chip or the neural network processor may be any proper hardware processor, for example, a CPU, a GPU, an FPGA, a digital signal processor (DSP), and an ASIC. The storage unit may be any proper magnetic storage medium or magneto-optic storage medium, for example, a resistive random access memory (RRAM), a DRAM, a SRAM, an enhanced dynamic random access memory (EDRAM), a high bandwidth memory (HBM), and a hybrid memory cube (HMC), and the like.

The application may be applied to numerous universal or dedicated computer system environments or configurations, for example, a personal computer (PC), a server computer, a handheld device or a portable device, a tablet device, a multiprocessor system, a microprocessor-based system, a set-top box, a programmable consumer electronic device, a network PC, a minicomputer, a large computer, and a distributed computation environment including any above-mentioned system or device.

According to an embodiment, the application provides a chip, which may include the abovementioned operation device. The chip may simultaneously perform various types of computation on a weight and an input neuron to achieve computational diversity. In addition, a dedicated on-chip cache for the multilayer artificial neural network computation algorithm is adopted, so that reusability of the input neurons and the weight data is fully mined, repeated reading of these data from the memory is avoided, a memory access bandwidth is reduced, and the problem that a memory bandwidth becomes a performance bottleneck of multilayer artificial neural network computation and a training algorithm of the multilayer artificial neural network computation is solved.

An embodiment of the application provides a chip package structure, which may include the abovementioned neural network processor.

An embodiment of the application provides a board card, which may include the abovementioned chip package structure.

An embodiment of the application provides an electronic device, which may include the abovementioned board card.

The electronic device may include, but is not limited to, a robot, a computer, a printer, a scanner, a tablet computer, an intelligent terminal, a mobile phone, an automobile data recorder, a navigator, a sensor, a webcam, a cloud server, a camera, a video camera, a projector, a watch, an earphone, a mobile storage, a wearable device, a transportation means, a household electrical appliance, and a medical device.

The transportation means may include an airplane, a ship, and/or a vehicle. The household electrical appliance may include a television, an air conditioner, a microwave oven, a refrigerator, an electric rice cooker, a humidifier, a washing machine, an electric lamp, a gas cooker, and a range hood. The medical device may include a nuclear magnetic resonance spectrometer, a B-ultrasonic scanner, and/or an electrocardiograph.

Those of ordinary skill in the art may realize that the units and algorithm steps of each example described in combination with the embodiments of the application may be implemented by electronic hardware, computer software, or a combination of the two. For clearly describing exchangeability of the hardware and the software, compositions and steps of each example have been generally described in the descriptions according to functions. Whether these functions are performed in a hardware or software manner depends on specific applications and design constraints of the technical solutions. Professionals may realize the described functions for each specific application by use of different methods, but such realization shall fall within the scope of the application.

Those skilled in the art may clearly know that, for convenient and brief description, working processes of terminals and units described above may refer to the corresponding processes in the method embodiments and will not be elaborated herein.

In the embodiments provided by the application, it is to be understood that the disclosed terminals and methods may be implemented in other manners. For example, the device embodiment described above is only schematic. For example, division of the units is only logical function division and another division manner may be adopted during practical implementation. For example, multiple units or components may be combined or integrated into another system or some characteristics may be neglected or not performed. In addition, coupling, direct coupling, or communication connection between each displayed or discussed component may be indirect coupling or communication connection, implemented through some interfaces, devices, or units, and may be electrical, mechanical, or in other forms.

The units described as separate parts may or may not be physically separated. Parts displayed as units may or may not be physical units, and for example, may be located in the same place, or may also be distributed in multiple network units. Part or all of the units may be selected to achieve the purpose of the solutions of the embodiments of the application according to a practical requirement.

In addition, each functional unit in the embodiments of the application may be integrated into a processing unit, each unit may also physically exist independently, and two or more units may also be integrated into one unit. The integrated unit may be implemented in the form of hardware or a software functional unit.

If being implemented in the form of a software functional unit and sold or used as an independent product, the integrated unit may be stored in a computer-readable storage medium. Based on such an understanding, all or part of the technical solutions may be embodied in form of software product. The computer software product is stored in a storage medium, including a plurality of instructions configured to enable a computer device (which may be a PC, a server, a network device, or the like) to perform all or part of the operations of the method in each embodiment of the application. The storage medium may include various media capable of storing program codes such as a U disk, a mobile hard disk, a read-only memory (ROM), a random access memory (RAM), a magnetic disk, or an optical disk.

It is to be noted that implementation modes which are not shown or described in the drawings or the body of the specification are all in forms known to those of ordinary skill in the art and are not described in detail. In addition, the definitions about each component and method are not limited to each specific structure, shape, or manner mentioned in the embodiments, to which those of ordinary skill in the art may make simple modifications or replacements.

The purposes, technical solutions, and beneficial effects of the application are further described above with the specific embodiments in detail. It is to be understood that the above is only the specific embodiment of the application and not intended to limit the application. Any modifications, equivalent replacements, improvements, and the like made within the spirit and principle of the application shall fall within the scope of protection of the application.

What is claimed:

1. An operation device, comprising:
   an instruction control unit configured to decode a received instruction and generate lookup control information; and
   a lookup table unit configured to identify output neurons in an operation codebook according to the lookup control information and a received weight dictionary, a neuron dictionary, an operation codebook, one or more groups of weights, and input neurons,
       wherein each of the one or more groups of weights are further clustered into multiple types of weights,
       wherein the weight dictionary includes weight indexes,
       wherein each of the weight indexes corresponds to one of the multiple types of weights,
       wherein the weight dictionary further includes weight positions,
       wherein the neuron dictionary includes the input neurons and neuron indexes, and
       wherein the operation codebook includes the weight indexes, the neuron indexes, and
   operation results of the input neurons and the weights,
   a preprocessing unit configured to preprocess input information to obtain the weights, the input neurons, the instruction, the weight dictionary, the neuron dictionary, and the operation codebook;
   a storage unit configured to store the input neurons, the weights, the weight dictionary, the neuron dictionary, the operation codebook, and the instruction, and receive the output neurons;
a cache unit configured to cache the instruction, the input neurons, the weights, the weight indexes, the neuron indexes, and the output neurons; and
a direct memory access (DMA) configured to read and write data or instructions between the storage unit and the cache unit.

2. The operation device of claim 1, wherein the cache unit includes:
an instruction cache configured to cache the instruction and output the cached instruction to the instruction control unit;
a weight cache configured to cache the weights;
an input neuron cache configured to cache the input neurons; and
an output neuron cache configured to cache the output neurons output by the lookup table unit.

3. The operation device of claim 2, wherein the cache unit further includes:
a weight index cache configured to cache the weight indexes; and
a neuron index cache configured to cache the neuron indexes.

4. The operation device of claim 2, wherein the preprocessing unit is configured to preprocess the input information according to one or more algorithms that include segmentation, Gaussian filtering, binarization, regularization, and/or normalization.

5. The operation device of claim 2, wherein the lookup table unit includes at least one lookup table selected from a group consisting of:
a multiplication lookup table that includes one or more multiplication results,
wherein each of the one or more multiplication results respectively corresponds to a central weight and a central neuron,
wherein the central weight corresponds to one of the weight indexes, and
wherein the central neuron corresponds to one of the neuron indexes;
an addition lookup table that includes one or more addition results, wherein each of the one or more addition results respectively corresponds to the central weight and the central neuron; and
a pooling lookup table that includes one or more pooling results that respectively correspond to a central data, wherein the one or more pooling results are determined based on pooling operations including average pooling, maximum pooling, and median pooling.

6. The operation device of claim 2, wherein the instruction is a neural network-dedicated instruction, and the neural network-dedicated instruction includes:
a control instruction configured to control a neural network execution process;
a data transfer instruction configured to complete data transfer between different storage media, a data format including a matrix, a vector, and a scalar;
an computation instruction configured to complete arithmetic operation of a neural network, wherein the computation instruction includes at least one of a matrix computation instruction, a vector computation instruction, a scalar computation instruction, a convolutional neural network computation instruction, a fully connected neural network computation instruction, a pooling neural network computation instruction, a Restricted Boltzmann Machine (RBM) neural network computation instruction, a Local Response Normalization (LRN) neural network computation instruction, a Local Contrast Normalization (LCN) neural network computation instruction, a Long short-term memory (LSTM) neural network computation instruction, a recurrent neural network (RNN) computation instruction, a rectified linear unit (ReLU) neural network computation instruction, a parametric rectified linear unit (PReLU) neural network computation instruction, a sigmoid neural network computation instruction, a tanh neural network computation instruction, or a maxout neural network computation instruction; and
a logical instruction configured to complete logical operation of the neural network and including a vector logical computation instruction and a scalar logical computation instruction.

7. The operation device of claim 6, wherein the neural network-dedicated instruction includes at least one Cambricon instruction including an operation code and an operand, and the Cambricon instruction includes:
a Cambricon control instruction configured to control the execution process, including a JUMP instruction and a conditional branch instruction;
a Cambricon data transfer instruction configured to complete data transfer between different storage media and including a load instruction, a store instruction, and a move instruction, where the load instruction is configured to load data from a main memory to a cache, the store instruction is configured to store the data from the cache to the main memory, and the move instruction is configured to move the data between the cache and another cache, between the cache and a register, or between the register and another register;
a Cambricon computation instruction configured to complete the arithmetic operation of the neural network and including a Cambricon matrix computation instruction, a Cambricon vector computation instruction, and a Cambricon scalar computation instruction, where the Cambricon matrix computation instruction is configured to complete matrix operation in the neural network, including matrix multiply vector operation, vector multiply matrix operation, matrix multiply scalar operation, outer product operation, matrix add matrix operation, and matrix subtract matrix operation, the Cambricon vector computation instruction is configured to complete vector operation in the neural network, including vector basic operations, vector transcendental functions operation, dot product operation, random vector generator operation, and operation of maximum/minimum of a vector, and the Cambricon scalar computation instruction is configured to complete scalar operation in the neural network, including scalar basic operations, and scalar transcendental functions operation; and
a Cambricon logical instruction configured for the logical operation of the neural network, including a Cambricon vector logical computation instruction and a Cambricon scalar logical computation instruction, where the Cambricon vector logical computation instruction includes vector compare operation, vector logical operation, and vector greater than merge operation, the vector logical operation includes AND, OR, and NOT, and the Cambricon scalar logical operation includes scalar compare operation and scalar logical operation.

8. The operation device of claim 7, wherein the Cambricon data transfer instruction supports one or more of the following data organization manners: matrix, vector, and scalar, the vector basic operations include vector addition, subtraction, multiplication, and division, the vector transcendental functions refer to functions which do not meet any polynomial equations taking polynomials as coefficients, and include an exponential function, a logarithmic function, a trigonometric function, and an anti-trigonometric function, the scalar basic operations include scalar addition, subtraction, multiplication, and division, the scalar transcendental functions refer to functions which do not meet any polynomial equations taking polynomials as coefficients, and include an exponential function, a logarithmic function, a trigonometric function, and an anti-trigonometric function, the vector compare includes greater than, smaller than, equal to, more than or equal to, less than or equal to, and unequal to, the vector logical operations include AND, OR, and NOT, the scalar compare includes greater than, smaller than, equal to, more than or equal to, less than or equal to, and unequal to, and the scalar logical operations include AND, OR, and NOT.

9. An operation method, comprising:
  receiving one or more groups of weights, input neurons, an instruction, a weight dictionary, a neuron dictionary, and an operation codebook;
  decoding the instruction to determine lookup control information; and
  identifying output neurons in the operation codebook according to the lookup control information, the weights, the weight dictionary, the neuron dictionary, and the input neurons,
    wherein each of the one or more groups of weights are further clustered into multiple types of weights,
    wherein the weight dictionary includes weight indexes,
    wherein each of the weight indexes corresponds to one of the multiple types of weights,
    wherein the weight dictionary includes the weight positions and the weight indexes;
    wherein the neuron dictionary includes the input neurons and the neuron indexes;
    wherein the operation codebook includes the weight indexes, the neuron indexes, and
  operation results of the weights and the input neurons,
  wherein the identifying the output neurons in the operation codebook according to the lookup control information, the weights, and the input neurons includes:
    determining neuron ranges to determine the neuron indexes in the neuron dictionary:
    determining the weight positions to determine the weight indexes in the weight dictionary according to the weights, the input neurons, the weight dictionary, and the neuron dictionary; and
    identifying the operation results in the operation codebook according to the weight indexes and the neuron indexes to determine the output neurons.

10. The operation method of claim 9, wherein the operation results include a result of at least one of the following operations: addition, multiplication, and pooling, where pooling includes average pooling, maximum pooling, and median pooling.

11. The operation method of claim 10, further comprising:
  preprocessing input information to obtain the weights, the input neurons, the instruction, the weight dictionary, the neuron dictionary, and the operation codebook;
  storing, after receiving the weights, the input neurons, the instruction, the weight dictionary, the neuron dictionary and the operation codebook, the weights, the input neurons, the instruction, the weight dictionary, the neuron dictionary, and the operation codebook;
  receiving the output neurons; and
  caching the instruction, the input neurons, the weights, and the output neurons.

12. The operation method of claim 11, further comprising caching the weight indexes and the neuron indexes.

13. The operation method of claim 12, wherein the preprocessing includes segmentation, Gaussian filtering, binarization, regularization, and/or normalization.

14. The operation method of claim 13, wherein the instruction is a neural network-dedicated instruction, and the neural network-dedicated instruction includes:
  a control instruction configured to control a neural network execution process;
  a data transfer instruction configured to complete data transfer between different storage media, a data format including a matrix, a vector, and a scalar;
  an computation instruction configured to complete arithmetic operation of a neural network, wherein the computation instruction includes at least one of a matrix computation instruction, a vector computation instruction, a scalar computation instruction, a convolutional neural network computation instruction, a fully connected neural network computation instruction, a pooling neural network computation instruction, a Restricted Boltzmann Machine (RBM) neural network computation instruction, a Local Response Normalization (LRN) neural network computation instruction, a Local Contrast Normalization (LCN) neural network computation instruction, a Long short-term memory (LSTM) neural network computation instruction, a recurrent neural network (RNN) computation instruction, a rectified linear unit (ReLU) neural network computation instruction, a parametric rectified linear unit (PReLU) neural network computation instruction, a sigmoid neural network computation instruction, a tanh neural network computation instruction, or a maxout neural network computation instruction; and
  a logical instruction configured to complete logical operation of the neural network and including a vector logical computation instruction and a scalar logical computation instruction.

15. The operation method of claim 14, wherein the neural network-dedicated instruction includes at least one Cambricon instruction including an operation code and an operand, and the Cambricon instruction includes:
  a Cambricon control instruction configured to control the execution process, including a JUMP instruction and a conditional branch instruction;
  a Cambricon data transfer instruction configured to complete data transfer between different storage media and including a load instruction, a store instruction and a move instruction, where the load instruction is configured to load data from a main memory to a cache, the store instruction is configured to store the data from the cache to the main memory, and the move instruction is configured to move the data between the cache and another cache or between the cache and a register or between the register and another register;
  a Cambricon computation instruction configured to complete the arithmetic operation of the neural network and including a Cambricon matrix computation instruction, a Cambricon vector computation instruction, and a Cambricon scalar computation instruction, where the Cambricon matrix computation instruction is configured to complete matrix operation in the neural network, including matrix multiply vector operation, vector multiply matrix operation, matrix multiply scalar operation, outer product operation, matrix add matrix operation, and matrix subtract matrix operation, the Cambricon vector computation instruction is configured to complete vector operation in the neural network, including vector basic operations, vector transcendental functions operation, dot product operation, random vector generator operation, and operation of maximum/minimum of a vector, and the Cambricon scalar computation instruction is configured to complete scalar operation in the neural network, including scalar basic operations and scalar transcendental functions operation; and a Cambricon logical instruction configured for the logical operation of the neural network, including a Cambricon vector logical computation instruction and a Cambricon scalar logical computation instruction, where the Cambricon vector logical computation instruction includes vector compare operation, vector logical operations, and vector greater than merge operation, the vector logical operations include AND, OR, and NOT, and the Cambricon scalar logical operation includes scalar compare operation and scalar logical operations.

16. The operation method of claim 15, wherein the Cambricon data transfer instruction supports one or more of the following data organization manners: the matrix, the vector, and the scalar, the vector basic operations include vector addition, subtraction, multiplication, and division, the vector transcendental functions refer to functions which do not meet any polynomial equations taking polynomials as coefficients, and include an exponential function, a logarithmic function, a trigonometric function, and an anti-trigonometric function, the scalar basic operations include scalar addition, subtraction, multiplication, and division, the scalar transcendental functions refer to functions which do not meet any polynomial equations taking polynomials as coefficients, and include an exponential function, a logarithmic function, a trigonometric function, and an anti-trigonometric function, vector compare includes greater than, smaller than, equal to, more than or equal to, less than or equal to, and unequal to, the vector logical operations include AND, OR, and NOT, the scalar compare includes greater than, smaller than, equal to, more than or equal to, less than or equal to, and unequal to, and the scalar logical operations include AND, OR, and NOT.

* * * * *